United States Patent
Merenda

(10) Patent No.: US 10,765,017 B2
(45) Date of Patent: *Sep. 1, 2020

(54) STORAGE SYSTEM FOR HANDHELD ELECTRONIC DEVICE

(71) Applicant: ADVANCE ACCESS TECHNOLOGIES LLC, New York, NY (US)

(72) Inventor: John T. Merenda, Brooklyn, NY (US)

(73) Assignee: ADVANCED ACCESS TECHNOLOGIES LLC, Brooklyn, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/390,601

(22) Filed: Apr. 22, 2019

(65) Prior Publication Data
US 2019/0246509 A1   Aug. 8, 2019

Related U.S. Application Data

(63) Continuation of application No. 15/083,165, filed on Mar. 28, 2016, now Pat. No. 10,271,441, which is a
(Continued)

(51) Int. Cl.
*H05K 5/00* (2006.01)
*B65H 75/48* (2006.01)
(Continued)

(52) U.S. Cl.
CPC ............ *H05K 5/0086* (2013.01); *A45C 11/00* (2013.01); *B65D 25/38* (2013.01); *B65H 75/364* (2013.01);
(Continued)

(58) Field of Classification Search
CPC ... H04R 1/1033; G06F 1/1607; G06F 1/1626; G06F 1/1635; G06F 1/1656;
(Continued)

(56) References Cited

U.S. PATENT DOCUMENTS

| 1,446,410 A | 2/1923 | Bennett et al. |
| 1,904,000 A | 4/1933 | Hoyt |

(Continued)

FOREIGN PATENT DOCUMENTS

| CN | 2414555 Y | 1/2001 |
| CN | 2445522 Y | 8/2001 |

(Continued)

OTHER PUBLICATIONS

IPOD® Player Case with Retrable Stero, <URL:http://www.amazon.com/ipd%ae-player-retractable-stereo-hadphones/dp/b000bt27mo>, retrieved from Internet on May 17, 2012.
(Continued)

*Primary Examiner* — Jesse A Elbin
(74) *Attorney, Agent, or Firm* — Im IP Law; Chai Im; C. Andrew Im

(57) ABSTRACT

A storage system includes a protective housing member configured to mate with a handheld electronic device. The protective housing member includes a charging area formed between a surface of the protective housing member and a surface of an accessory item of the handheld electronic device. The charging area is configured to charge the accessory item of the handheld electronic device. The charging area is powered by at last one power component of the protective housing member or at least one power component of the handheld electronic device. The storage system further includes at least one integrated circuit which is either a component of the handheld electronic device or a component of the protective housing member.

10 Claims, 18 Drawing Sheets

Related U.S. Application Data continuation of application No. 14/711,735, filed on May 13, 2015, now Pat. No. 9,313,905, which is a continuation of application No. 14/503,467, filed on Oct. 1, 2014, now Pat. No. 9,065,921, which is a continuation of application No. 14/182,645, filed on Feb. 18, 2014, now Pat. No. 8,879,773, which is a continuation of application No. 13/872,157, filed on Apr. 29, 2013, now Pat. No. 8,774,446, which is a continuation of application No. PCT/US2013/038599, filed on Apr. 29, 2013, which is a continuation-in-part of application No. 29/430,245, filed on Aug. 23, 2012, now Pat. No. Des. 698,772, which is a continuation-in-part of application No. 29/417,184, filed on Mar. 20, 2012, now Pat. No. Des. 667,823.

(60) Provisional application No. 61/639,968, filed on Apr. 29, 2012.

(51) Int. Cl.
| | |
|---|---|
| *H05K 5/02* | (2006.01) |
| *H04M 1/60* | (2006.01) |
| *H04M 1/02* | (2006.01) |
| *G06F 1/16* | (2006.01) |
| *H04R 1/10* | (2006.01) |
| *G06F 1/10* | (2006.01) |
| *B65D 25/38* | (2006.01) |
| *B65H 75/36* | (2006.01) |
| *A45C 11/00* | (2006.01) |
| *H04R 1/02* | (2006.01) |
| *H04M 1/15* | (2006.01) |
| *H04M 1/18* | (2006.01) |
| *B65H 75/44* | (2006.01) |
| *H02J 7/34* | (2006.01) |

(52) U.S. Cl.
CPC ............ *B65H 75/48* (2013.01); *G06F 1/105* (2013.01); *G06F 1/1656* (2013.01); *H04M 1/0258* (2013.01); *H04M 1/6058* (2013.01); *H04R 1/02* (2013.01); *H04R 1/028* (2013.01); *H04R 1/1025* (2013.01); *H04R 1/1033* (2013.01); *H04R 1/1041* (2013.01); *H05K 5/0217* (2013.01); *A45C 2011/003* (2013.01); *B65H 75/44* (2013.01); *B65H 75/4431* (2013.01); *B65H 2701/34* (2013.01); *B65H 2701/3919* (2013.01); *B65H 2701/533* (2013.01); *H02J 7/342* (2020.01); *H04M 1/15* (2013.01); *H04M 1/185* (2013.01); *H04R 2499/11* (2013.01)

(58) Field of Classification Search
CPC ..... A45F 2200/0508; A45F 2200/0516; B65H 75/4431; B65H 75/406; B65H 75/4418; B65H 75/4436; B65H 75/4442; B65H 75/4447; B65H 2701/3919; H04M 1/0262; H04M 1/0254
USPC ....... 381/74, 338, 339, 370, 395; 455/575.8; 700/94
See application file for complete search history.

(56) References Cited

U.S. PATENT DOCUMENTS

| | | |
|---|---|---|
| 1,958,626 A | 5/1934 | Krantz |
| 2,013,733 A | 9/1935 | Murphy |
| 2,211,561 A | 8/1940 | Flannelly |
| 2,438,515 A | 3/1948 | Mohler |
| 2,518,071 A | 8/1950 | Rushworth |
| 2,521,226 A | 9/1950 | Keller |
| 3,061,234 A | 10/1962 | Morey |
| 3,144,218 A | 8/1964 | Tepe |
| 3,374,319 A | 3/1968 | Stahmer |
| 3,657,491 A | 4/1972 | Ryder et al. |
| 3,773,987 A | 11/1973 | Davis et al. |
| 3,782,654 A | 1/1974 | Kasa |
| 3,984,645 A | 10/1976 | Kresch |
| 4,384,688 A | 5/1983 | Smith |
| 4,584,718 A | 4/1986 | Fuller |
| 4,646,987 A | 3/1987 | Peterson |
| 4,754,484 A | 6/1988 | Larkin et al. |
| D301,034 S | 5/1989 | Fujita et al. |
| 4,942,617 A | 7/1990 | Boylan |
| 4,989,805 A | 2/1991 | Burke |
| 5,118,309 A | 6/1992 | Ford |
| 5,332,171 A | 7/1994 | Steff |
| 5,388,155 A | 2/1995 | Smith |
| 5,422,957 A | 6/1995 | Cummins |
| 5,684,883 A | 11/1997 | Chen |
| 5,706,353 A | 1/1998 | Arai et al. |
| 5,724,667 A | 3/1998 | Furuno |
| D397,246 S | 8/1998 | Hoofnagle et al. |
| D414,178 S | 9/1999 | Loubert et al. |
| D427,170 S | 6/2000 | Edwards et al. |
| D434,739 S | 12/2000 | Hanna et al. |
| 6,301,487 B1 | 10/2001 | Nakamura |
| 6,374,126 B1 | 4/2002 | MacDonald, Jr. et al. |
| 6,438,248 B1 | 8/2002 | Kamimura et al. |
| 6,439,491 B1 | 8/2002 | Liao |
| 6,542,757 B2 | 4/2003 | Bae |
| RE38,211 E | 8/2003 | Peterson et al. |
| 6,633,770 B1 | 10/2003 | Gitzinger et al. |
| 6,644,582 B1 | 11/2003 | Liao |
| 6,712,304 B1 | 3/2004 | Taylor |
| 6,731,956 B2 | 5/2004 | Hanna et al. |
| 6,733,328 B2 | 5/2004 | Lin et al. |
| 6,736,346 B1 | 5/2004 | Park |
| 6,808,138 B2 | 10/2004 | Liao |
| 6,834,820 B2 | 12/2004 | Wei |
| 6,851,530 B2 | 2/2005 | Wei |
| 6,866,219 B2 | 3/2005 | Vvei |
| 6,871,812 B1 | 3/2005 | Chang |
| D510,722 S | 10/2005 | Kosiba et al. |
| 7,001,210 B1 | 2/2006 | Chiang |
| 7,032,728 B2 | 4/2006 | Harcourt |
| 7,086,512 B2 | 8/2006 | Shack et al. |
| 7,151,912 B1 | 12/2006 | Morrison |
| 7,180,735 B2 | 2/2007 | Thomas et al. |
| D543,197 S | 5/2007 | Loughnane |
| 7,216,665 B1 | 5/2007 | Sims, Jr. |
| D551,846 S | 10/2007 | Ko et al. |
| D559,826 S | 1/2008 | Lee |
| D560,911 S | 2/2008 | Hackbart et al. |
| 7,399,198 B2 | 7/2008 | Thalheimer et al. |
| D574,819 S | 8/2008 | Andre et al. |
| 7,523,883 B2 | 4/2009 | Cheng |
| D603,603 S | 11/2009 | Laine et al. |
| 7,648,027 B2 | 1/2010 | Lin et al. |
| D609,900 S | 2/2010 | Behar et al. |
| D611,251 S | 3/2010 | Charlwood |
| 7,681,822 B2 | 3/2010 | Tai |
| D619,130 S | 7/2010 | Fellig |
| D622,692 S | 8/2010 | McWilliam et al. |
| D622,716 S | 8/2010 | Andre et al. |
| 7,784,727 B1 | 8/2010 | Liao |
| D623,180 S | 9/2010 | Diebel |
| D624,114 S | 9/2010 | Ausems et al. |
| 7,802,746 B2 | 9/2010 | Ito et al. |
| 7,822,448 B2 | 10/2010 | Lin et al. |
| 7,868,585 B2 | 1/2011 | Sarnowsky et al. |
| 7,889,494 B2 * | 2/2011 | Stampfli .................. A45F 5/00 224/663 |
| D635,131 S | 3/2011 | Roman |
| 7,909,281 B2 | 3/2011 | Liao |
| D639,052 S | 6/2011 | Fatholahi |
| D654,068 S | 2/2012 | Monaco et al. |
| D654,483 S | 2/2012 | Richardson et al. |
| D654,931 S | 2/2012 | Lemelman et al. |

(56) References Cited

U.S. PATENT DOCUMENTS

| | | |
|---|---|---|
| 8,136,751 B2 | 3/2012 | Chen |
| 8,265,325 B2 | 9/2012 | Park |
| 8,365,887 B2 | 2/2013 | Fischer |
| 9,066,181 B2 * | 6/2015 | Kroupa ............. B65H 75/4434 |
| 9,246,221 B2 * | 1/2016 | Jin ......................... H01Q 7/005 |
| 9,319,766 B2 * | 4/2016 | Weinstein ................ H04R 1/10 |
| 2002/0023814 A1 | 2/2002 | Poutiatine |
| 2002/0176571 A1 | 11/2002 | Louh |
| 2003/0096640 A1 | 5/2003 | Bae |
| 2003/0157973 A1 | 8/2003 | Yang |
| 2003/0224839 A1 | 12/2003 | Takahashi et al. |
| 2004/0094649 A1 | 5/2004 | Park |
| 2004/0204165 A1 | 10/2004 | Huang |
| 2004/0256188 A1 | 12/2004 | Harcourt |
| 2005/0109869 A1 | 5/2005 | Wei |
| 2005/0220316 A1 | 10/2005 | Hsiang |
| 2005/0255898 A1 | 11/2005 | Huang |
| 2006/0011763 A1 | 1/2006 | Kuo |
| 2006/0058081 A1 | 3/2006 | Reichenbach |
| 2006/0281502 A1 | 12/2006 | Chang |
| 2007/0165371 A1 | 7/2007 | Bradenburg |
| 2007/0295850 A1 | 12/2007 | Lin |
| 2008/0080732 A1 | 4/2008 | Sneed |
| 2009/0325648 A1 | 12/2009 | Shi |
| 2010/0279743 A1 | 11/2010 | Sim |
| 2011/0031341 A1 | 2/2011 | He |
| 2011/0130174 A1 | 6/2011 | Kroupa |
| 2011/0139918 A1 | 6/2011 | Chen |
| 2011/0170732 A1 | 7/2011 | Parker et al. |
| 2011/0233078 A1 | 9/2011 | Monaco et al. |
| 2012/0114162 A1 | 5/2012 | Zheng |
| 2012/0224739 A1 | 9/2012 | Cataldo et al. |
| 2012/0225701 A1 | 9/2012 | Cataldo et al. |
| 2013/0208937 A1 | 8/2013 | Stern et al. |
| 2013/0237290 A1 | 9/2013 | Simmons et al. |
| 2013/0238829 A1 | 9/2013 | Laycock et al. |

FOREIGN PATENT DOCUMENTS

| | | |
|---|---|---|
| CN | 2448037 Y | 9/2001 |
| CN | 2453619 Y | 10/2001 |
| CN | 2462624 Y | 11/2001 |
| CN | 2488233 Y | 4/2002 |
| CN | 2489532 Y | 5/2002 |
| CN | 2509787 Y | 9/2002 |
| CN | 2792050 Y | 6/2006 |
| CN | 2843005 Y | 11/2006 |
| CN | 101090278 A | 12/2007 |
| CN | 101090617 A | 12/2007 |
| CN | 201087963 Y | 7/2008 |
| CN | 201123116 Y | 9/2008 |
| CN | 201156758 Y | 11/2008 |
| CN | 101087316 B | 11/2011 |
| WO | 2013074154 A1 | 5/2013 |

OTHER PUBLICATIONS

EarGears Phone Case with Built-in Retractable Headphones, shipping for iPhone 4 platform beginning Apr. 2012, <URL:http://www.ear-gears.com/>.

Sangean DT-220A AM/FM Stereo Pocket Size Radio with Self-Storage Headphones, earliest customer review on Feb. 21, 2004 <URL: http://www.amazon.com/sangean-dt-220a-stereo-self-storage-headphones/dp/b00008aybf>.

Azeca Clip-On Bluetooth Headset with retractable earbud, posted on Mar. 15, 2012, <URL: http://thegeekchurch.com/wp-content/uploads/2012/03/azeca-retractable.png.

www.quirky.com/ideations/165787, Automatic Wire Retractor Phone Case, Mar. 29, 2012, 1 page.

* cited by examiner

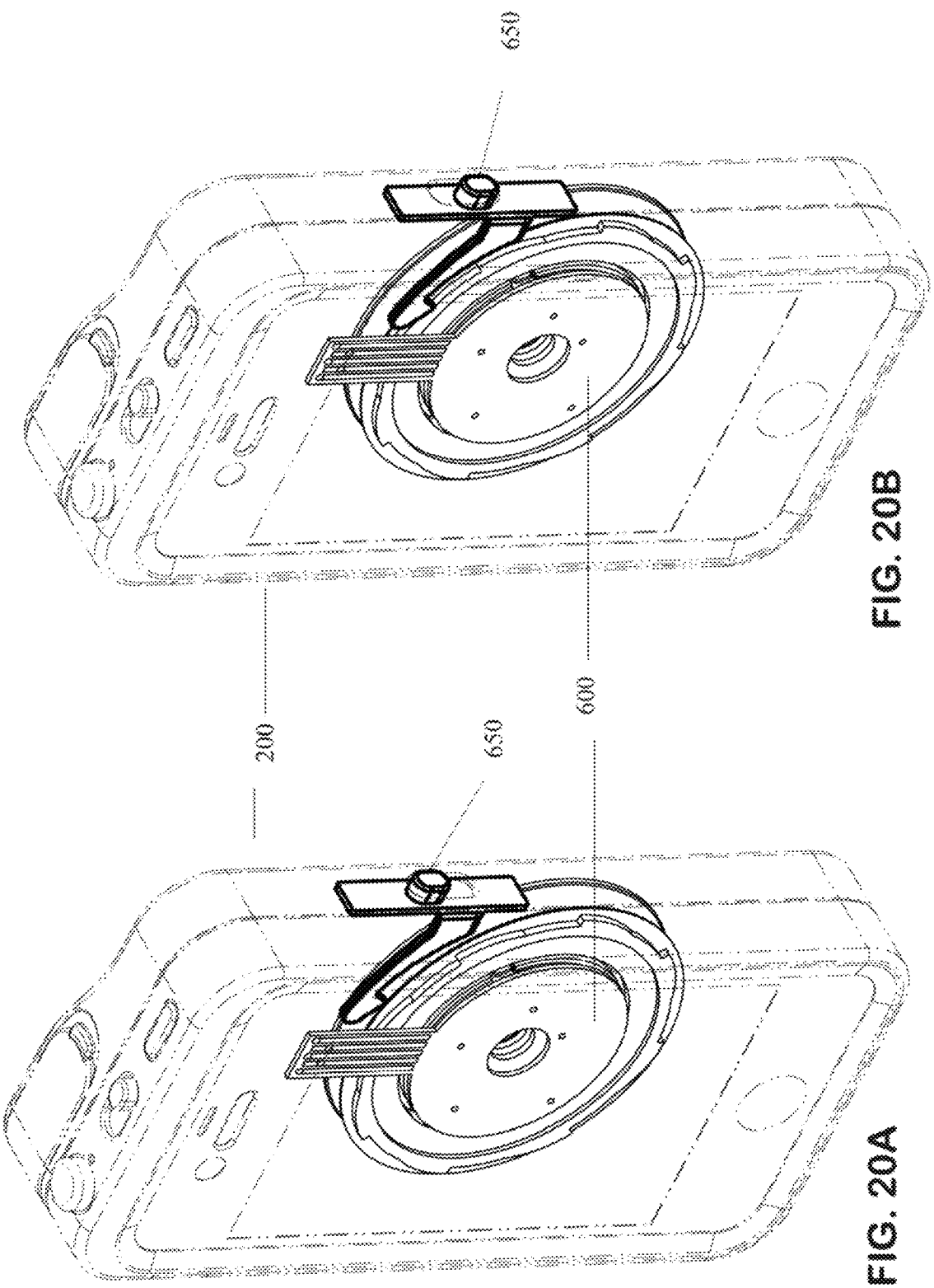

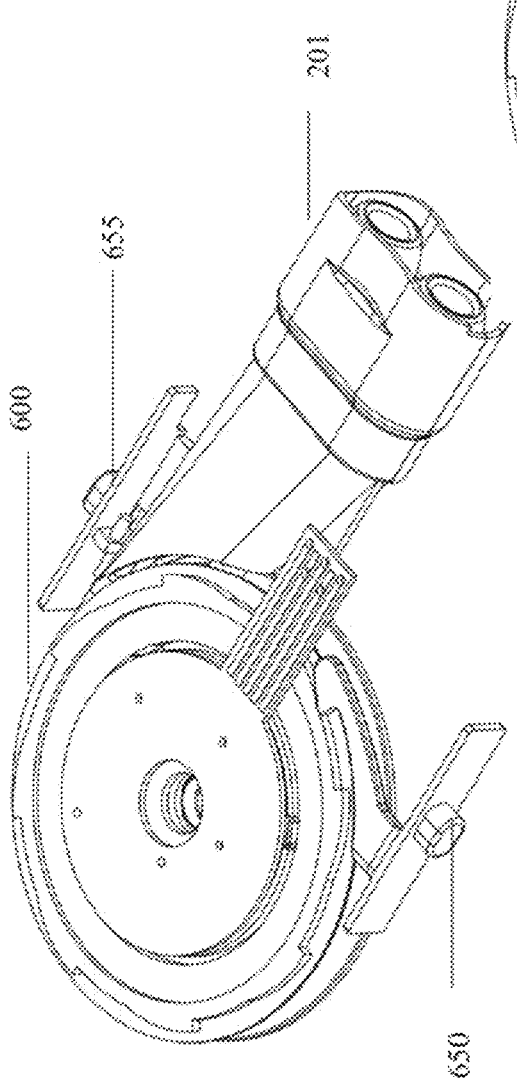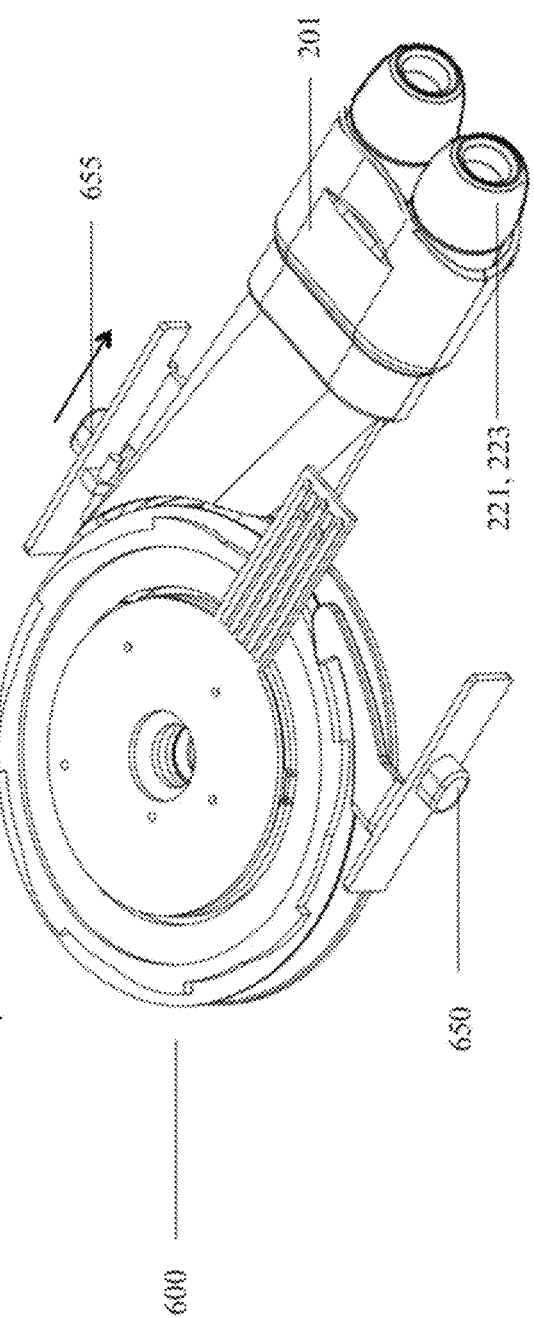
FIG. 24A
FIG. 24B

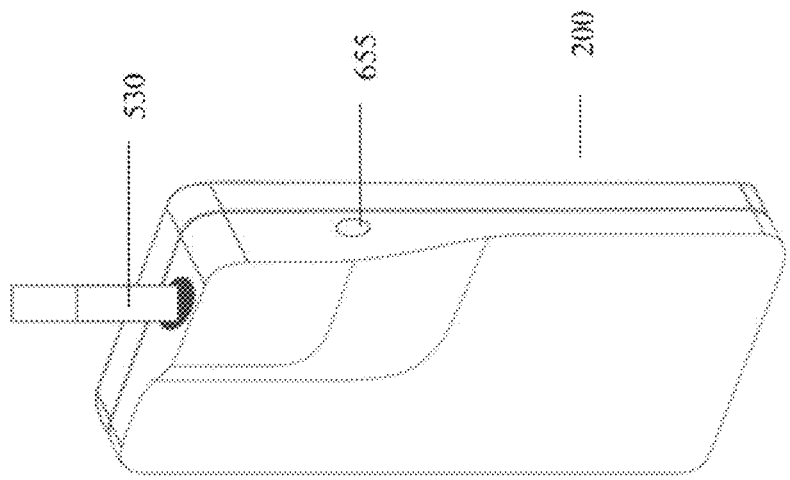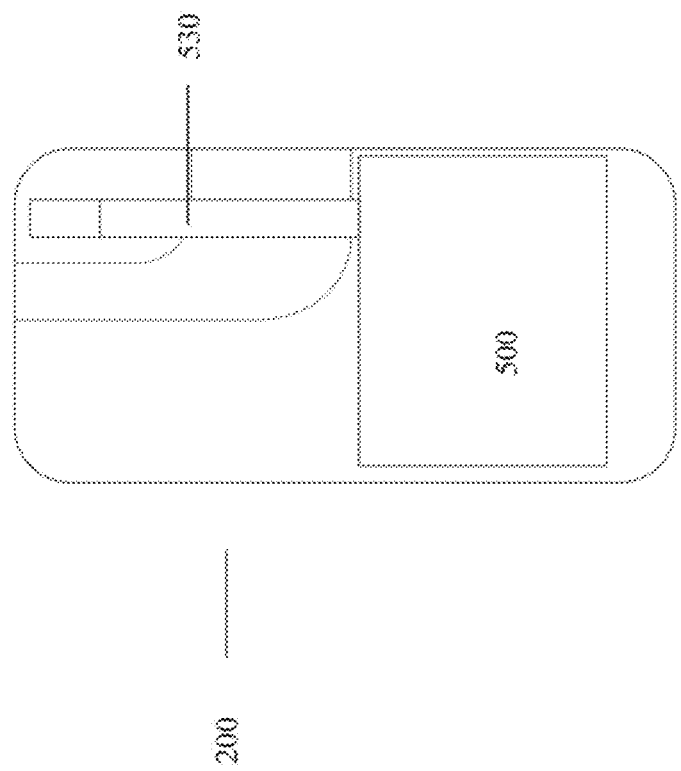
FIG. 25A
FIG. 25B

STORAGE SYSTEM FOR HANDHELD ELECTRONIC DEVICE

RELATED APPLICATIONS

The present application is a continuation of U.S. application Ser. No. 15/083,165 filed Mar. 28, 2016, which is a continuation of U.S. application Ser. No. 14/711,735 filed May 13, 2015, now U.S. Pat. No. 9,313,905, which is a continuation of U.S. application Ser. No. 14/503,467 filed Oct. 1, 2014, now U.S. Pat. No. 9,065,921, which is a continuation of U.S. application Ser. No. 14/182,645 filed Feb. 18, 2014, now U.S. Pat. No. 8,879,773, which is a continuation of U.S. application Ser. No. 13/872,157 filed Apr. 29, 2013, now U.S. Pat. No. 8,774,446, which claims the benefit of U.S. Provisional Application No. 61/639,968 filed Apr. 29, 2012, each of which is incorporated herein by reference in its entirety.

U.S. application Ser. No. 13/872,157 filed Apr. 29, 2013, now U.S. Pat. No. 8,774,446, is a continuation-in-part application of U.S. application Ser. No. 29/430,245 filed Aug. 23, 2012, now U.S. Pat. No. D698,772, which is a continuation-in-part application of U.S. application Ser. No. 29/417,184 filed Mar. 30, 2012, now U.S. Pat. No. D667,823, each of which is incorporated herein by reference in its entirety.

U.S. application Ser. No. 13/872,157 filed Apr. 29, 2013, now U.S. Pat. No. 8,774,446, is a continuation of PCT Application No. PCT//US2013/038599 filed Apr. 29, 2013, which claims the benefit of U.S. Provisional Application No. 61/639,968 filed Apr. 29, 2012 and U.S. application Ser. No. 29/430,245 filed Aug. 23, 2012, now U.S. Pat. No. D698,772, each of which is incorporated herein by reference in its entirety.

BACKGROUND OF THE INVENTION

1. Field of the Invention

The present invention relates to accessory systems for handheld electronic devices, more particularly, the present invention provides a protective carrier system that houses a handheld electronic device and provides retractable earphones, earphone station and storage to the handheld electronic device.

2. Description of the Related Art

Handheld electronic devices are becoming more and more popular as consumer goods and are frequently used in performing our daily communication needs. Devices like the iPhone™, iPad™, iPod™, Blackberry™, cell phones, mobile video players, KINDLE™ eReaders, Android™ devices are now intimate parts of daily life. This popularity has created a desire for protective cases well as varieties of choice for aesthetic freshness that enable these devices with a look of consumer-preferred style with modest cost. Additionally these protective cases have become increasingly armored (stronger) to protect against unintended breakage.

For example, U.S. Pat. No. 7,648,027, the entire contents of which are enclosed by reference, describes a protective apparatus to accommodate a portable device, such as a cell phone, with a wire-wrap member attached at the back panel. It does not address the problem of tangled headphone/earbud cable when it is wound in such a manner. The headphone/earbud cable can not only become damaged, but tangles are inadvertently created.

US Patent Pub. No. 2011/0233078, also incorporated herein by reference, describes a holder design for portable devices that also provides a storage compartment for earphones. It uses a spring loaded type rewinder which can subject the headphone/earbud cable to undue pressure. The spring loaded rewinder can create drastic, uncontrollable speed of the rotating wheel upon release of the spring loaded mechanism to rewind the cable, thereby damaging and/or shortening the life of the cable. Also of related example are U.S. Published Application No. 2011/0170732 (Parker), U.S. Pat. No. 6,731,956 (Hanna et al.), and U.S. Published Application No. 2010/0279743 (Sim), the contents of all of which are incorporated herein by reference. Each of these devices utilizes a spring loaded mechanism to retract the headphone/earbud cable. These spring loaded device can create drastic, uncontrollable speed of the rotating wheel or spring reel upon release of the spring loaded mechanism to rewind/retract the cable, thereby subjecting the cables to undue pressure, and damaging and/or shortening the life of the cable.

Accordingly, the claimed invention proceeds upon the desirability of providing a storage system for handheld electronic device that safely retracts and stores items.

OBJECTS AND SUMMARY OF THE INVENTION

Proposed is a novel carrier system with built-in retractable earphone/earbud system that accommodates a variety of earphone styles and is adaptable for a variety of handheld electronic devices are disclosed.

In accordance with an exemplary embodiment of the claimed invention, an easy to put on carrier case, can be made of molded plastic having a wrap-around side walls, a back panel and an open front aperture for a handheld electronic device to slide into. The back panel being of monolithic construction and having an enlarged compartment built at the top area for inclusion with an earbud station. The earbud station provides secure fixed hosting seats for a pair of pullable or electable earbuds/earphones to sit into when not being used. Various apertures are configured in the wrap-around side walls to allow direct access to various buttons on the electronic device.

In accordance with an exemplary embodiment of the claimed invention, a pair of bounded regions or chambers with related wire channels for containing earphone/ear bud cables are configured monolithically and directly in the back panel. Earphones/earbuds with their long cables being wrapped into the chambers, and a channel to allow the plug head to be fixedly held at the earbud station for easily plug in to the headphone jack of a handheld device.

In accordance with an exemplary embodiment of the claimed invention, a middle panel, or cassette member, is configured similarly with a pair of chambers and operable wire channels for containing and guiding earphone/earbud cables.

In accordance exemplary embodiment of the claimed invention, one of the chambers is fixedly mounted with an exterior antenna/transmitter IC chip that provides a secondary amplification for a cell phone signal, providing a solution for limited cell phone signal amplification due to space limitation inside a cell phone (such as an iPhone™ or an iPad™).

In accordance with an exemplary embodiment of the claimed invention, a retractable storage system for a handheld electronic device comprises a protective housing member having a back panel and plurality of side walls forming a bounding member operative shaped and sized to bound the handheld device and enable wrapping around the handheld device. An enlarged compartment is configured proximate the back panel, intersecting with a top side wall of the housing member. The top side wall forms an aperture in connecting with the compartment. An accessory station is mounted inside the compartment and forms aperture structure for arresting and dispensing an accessory item of the handheld device. A removable middle panel is removably mounted inside the housing member, in parallel to the back panel, having a top edge neighboring and below the enlarged compartment. One or more storage chambers are structured on the removable middle panel for storing the accessory item, connecting with one or more channels wherein the channels leading to the accessory station.

In accordance with an exemplary embodiment of the claimed invention, the aforesaid retractable storage system further comprises at least one earphone cable with a earbud and a plug head, and at least one retractable mechanism which is operably mounted inside one of the storage chamber for automatically retracting a cable for storage. The earbud is removably secured in said accessory station, the cable being removably coiled within a spring-biased spool of said retractable mechanism, and a plug head of said cable being connected to a earphone jack of the handheld device, wherein said earphone is pulled from the accessory station with the cable extending from said storage chamber when in use.

In accordance with an exemplary embodiment of the claimed invention, the aforesaid retractable mechanism comprises a friction based braking system to reduce a rotational speed of the spring-biased spool during the retraction of the cable.

In accordance with an exemplary embodiment of the claimed invention, the aforesaid friction based braking system comprises at least one damping pad to reduce the rotational speed of the spring-biased spool during the retraction of the cable.

In accordance with an exemplary embodiment of the claimed invention, the aforesaid retractable storage system comprises a retraction button to control the retractable mechanism to retract the cable.

In accordance with an exemplary embodiment of the claimed invention, the aforesaid retraction button is a spring loaded such that the retraction button remains in or returns to a first position unless the retraction button is moved and held at a second position to retract the cable to the storage chamber.

In accordance with an exemplary embodiment of the claimed invention, the aforesaid retractable storage system comprises a plug head actuation system for operably removing and connecting the plug head of the cable to the earphone of the handheld device.

In accordance with an exemplary embodiment of the claimed invention, the aforesaid retractable storage system comprises an accessory button to dispense the earbud from the accessory station.

In accordance with an exemplary embodiment of the claimed invention, the aforesaid accessory button is a spring loaded such that the accessory button remains in or returns to a first position unless the accessory button is moved and held at a second position to dispense the earbud from the accessory station.

In accordance with an exemplary embodiment of the claimed invention, the aforesaid retractable storage system comprises a pair of earphones, each connected to a separate cable, and two retractable mechanism. Each retractable mechanism is mounted inside its respective storage chamber for automatically retracting is respective cable. Each retractable mechanism is independently controlled such that each cable is independently retractable.

In accordance with an exemplary embodiment of the claimed invention, the aforesaid retractable storage system comprises a first and second retraction buttons to independently control the respective retractable mechanism.

In accordance with an exemplary embodiment of the claimed invention, each aforesaid retraction button is a spring loaded such that each retraction button remains in or returns to a first position unless each retraction button is moved and held at a second position to retract the respective cable to the respective storage chamber.

In accordance with an exemplary embodiment of the claimed invention, the aforesaid retractable storage system comprises a headphone cable with an audio plug and a headphone plug, and a retractable mechanism which is operably mounted inside a storage chamber for automatically retracting the headphone cable for storage. The headphone plug is removably secured in the accessory station. The headphone cable is removably coiled within a spring-biased spool of the retractable mechanism. The audio plug head is connected to a earphone jack of the handheld device. The headphone plug is pulled from the accessory station with the cable extending from the storage chamber for use with a headphone.

In accordance with an exemplary embodiment of the claimed invention, the aforesaid retractable storage system comprises a retraction button to control the retractable mechanism to retract said headphone cable.

In accordance with an exemplary embodiment of the claimed invention, the aforesaid retractable storage system comprises a pair of earphones, each connected to a separate magnetized cable. Each magnetized cable is magnetically attracted to each other to form a single cable which can be removably coiled within the same spring-biased spool of the retractable mechanism. The earphone is pulled from the accessory station with the single cable extending from the storage chamber and peelable into two separate cables when in use.

In accordance with an exemplary embodiment of the claimed invention, the aforesaid accessory item is at least one of the following: a lip balm, a lipstick, a cigarette or a cigar. The aforesaid retractable storage system further comprises an accessory button to dispense the accessory item from the storage chamber through the accessory station.

In accordance with an exemplary embodiment of the claimed invention, the aforesaid retractable storage system comprises at least one battery mounted inside a storage chamber for charging at least an accessory item or the handheld device. The accessory station is a charging station which is electrically connected to the battery to charge the accessory item stored within the charging station.

In accordance with an exemplary embodiment of the claimed invention, the aforesaid accessory item is a wireless earbuds or e-cigarettes. The aforesaid retractable storage system further comprises an accessory button to dispense the accessory item from the charging station.

In accordance with an exemplary embodiment of the claimed invention, the aforesaid accessory station comprises a station adapter configured with elastic material to adjust the aperture size of the accessory station.

In accordance with an exemplary embodiment of the claimed invention, the aforesaid retractable storage system comprises a plurality of colored LEDs to display a logo, advertisement or aesthetically pleasing patterns on the back panel of the housing member. The handheld electronic device is operably connected to the LEDs to control and change the patterns, logo or advertisement displayed by the LEDs.

The above and other aspects, features and advantages of the present invention will become apparent from the following description read in conjunction with the accompanying drawings, in which like reference numerals designate the same elements.

BRIEF DESCRIPTION OF THE DRAWINGS

FIGS. 20A-B are perspective views of a retractable storage system with a retractable mechanism engaged and disengaged, respectively, for retracting a cable in accordance with an exemplary embodiment of the claimed invention;

FIGS. 24A-B are exploded perspective view of the retractable mechanism for storing and housing earphone cables with a retraction button to control the retraction mechanism and an accessory button to dispense a pair of earbuds from an accessory station in accordance with an exemplary embodiment of the claimed invention;

FIGS. 25A-B are back view and perspective view of a retractable storage system for storing, charging and dispensing e-cigarette in accordance with an exemplary embodiment of the claimed invention.

DETAILED DESCRIPTION OF THE EMBODIMENTS

Figure 2:
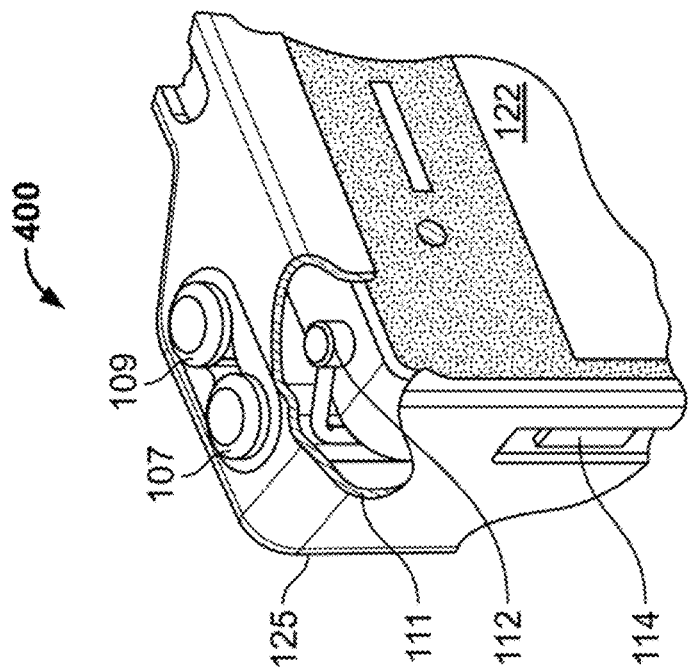
FIG. 2 is an enlarged partially cut-away view of the upper side of the compartment area for earphone/earbud station in accordance with an exemplary embodiment of the claimed invention.

Reference will now be made in detail to embodiments of the claimed invention. Wherever possible, same or similar reference numerals are used in the drawings and the description to refer to the same or like parts or steps. The drawings are in simplified form and are not to precise scale. For purposes of convenience and clarity only, directional (up/down, etc.) or motional (forward/back, etc.) terms may be used with respect to the drawings. These and similar directional terms should not be construed to limit the scope of the invention in any manner.

It will be understood that the phrases earbud and earphone, singularly or in plural form, may be used interchangeably and without limitation, such that earbud(s) or an earphone(s) system or element can be understood to operate in accordance with this inventive disclosure.

For simplicity and clarity of illustration, the drawing figures illustrate the general manner of construction, and description and details of well-known features and techniques may be omitted to avoid unnecessarily obscuring the invention.

The terms "first," "second," "third," "fourth," and the like in the description and the claims, if any, may be used for distinguishing between similar elements and not necessarily for describing a particular sequential or chronological order. It is to be understood that the terms so used are interchangeable. It is also understood, that the phrases embodiment or version may be used interchangeably and without undue limitation. There is no restriction such that an embodiment is more or less restrictive or definitive than a version of the present invention. Furthermore, the terms "comprise," "consisting of", "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

It is contemplated and intended that the operative embodiments or versions of the claimed invention may be readily modified to any suitable handheld devices of any size that provides an audio output or interconnection system and thus may take earbud/earphone jacks; for clarity reason, the examples are given based on IPOD™ or IPHONE™ but will be understood to apply to any hand-held device, cell phone, smart phone, computer, laptop, tablet, ereader or otherwise without limitations. The case shapes may be molded with metal, rubber, plastic, or of any other formable material or combination of materials having variable module(s) of elasticity. Thus a rigid plastic bottom may be co-molded with a more flexible plastic side wall, and a slick-slippery sided guide channel portions. A variety of colors and material patterns may be used for styles and fashions.

Figure 1:
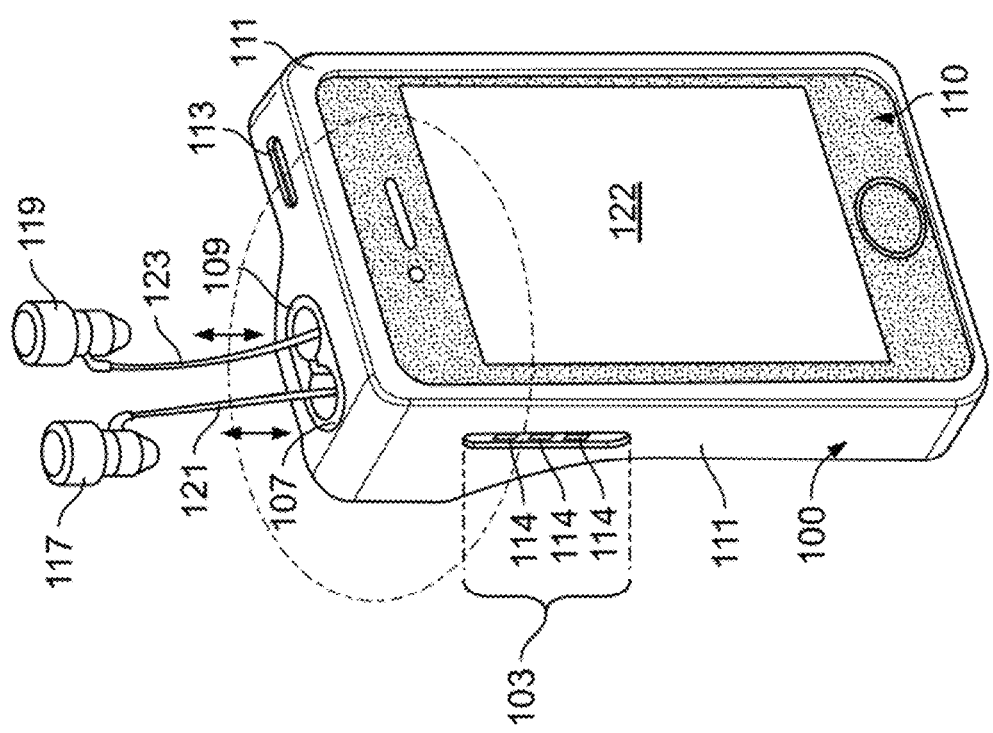
FIG. 1 is a perspective view of a retractable storage system housing a handheld device in accordance with an exemplary embodiment of the claimed invention.

In reference to FIGS. 1 and 2, handheld electronic device system 110, for example, an IPOD™/IPHONE™ is contained inside the housing 111 of carrier case 100. In accordance with an exemplary embodiment of the claimed invention, housing 111 is made of a thin layer of plastic, leather material, rubber or other moldable and flexible durable and light material, provides a protective layer for device 110 from scratching and other damages. Housing 111 is built in variety of shapes and sizes to tightly match the various designs of handheld devices and is not limited to the shapes shown. For example, it can be rectangular and with sufficient thickness to match an iPHONE™, or it can be square to match a KINDLE™ eReader. It can also provide a personalized and customized pattern or color for a user to have a feel of fashion or personal decoration. Various apertures 103, 113 on the side wall or top side of the case 100 can be configured to accommodate access to various buttons of the electronic device 110, such as power button 120, volume control button 114, and ports, such as USB port.

In accordance with an exemplary embodiment of the claimed invention, carrier case 100 does not have a front panel, allowing full direct access to the front screen 122 of device 110. Especially for touch screen devices, this front opening is functionally convenient, yet elegant in style. The edge of side walls of housing 111 is slightly curved as a retaining lip to increase the holding grip on device 110. Alternatively, the side walls of housing 111 is a rubberized surface to increase the holding grip on device 110.

Figure 3:
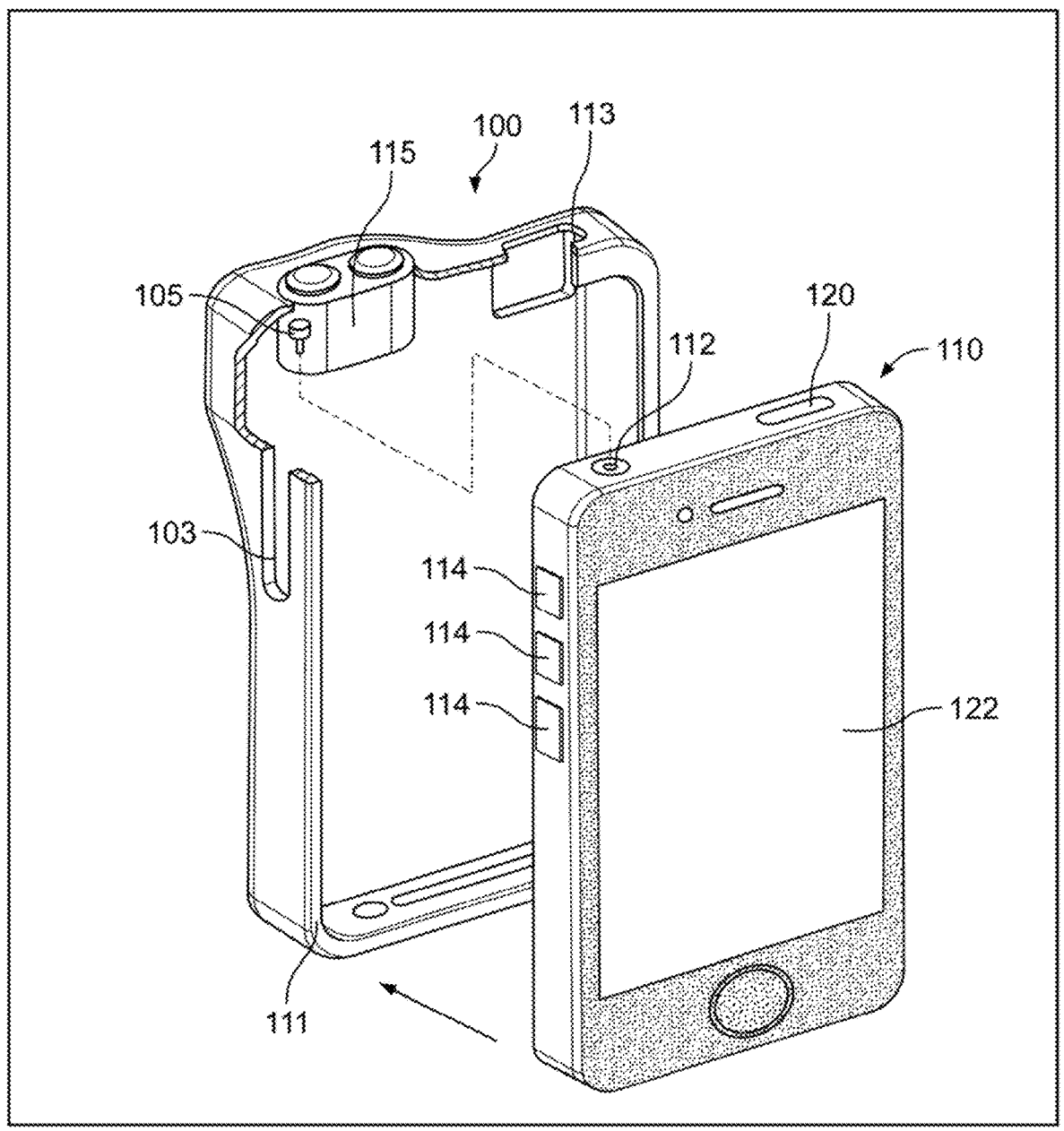
FIG. 3 is an exploded perspective view of a retractable storage system for storing earphone cables and a handheld electronic device for assembling together in accordance with an exemplary embodiment of the claimed invention.
Figure 4:
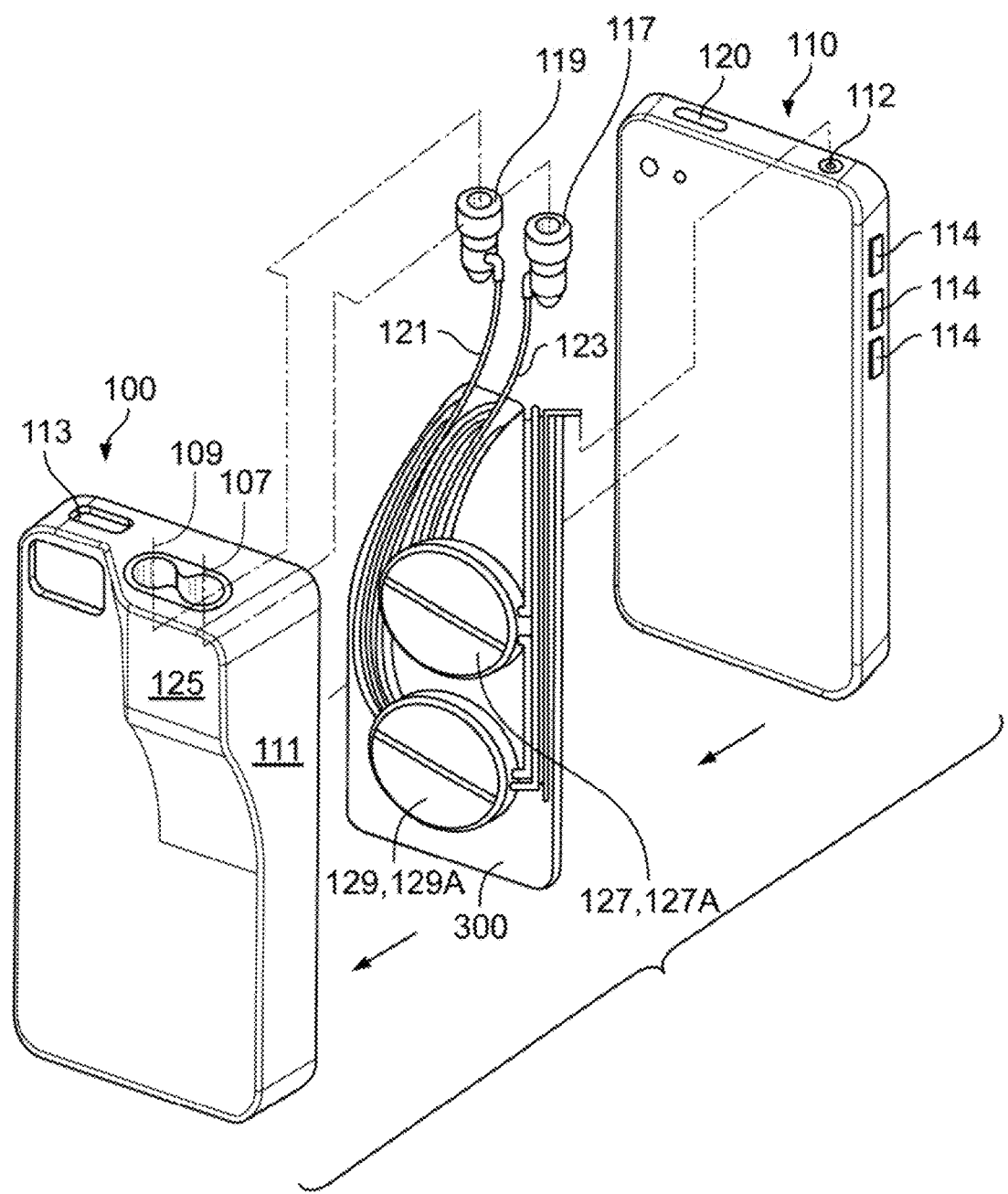
FIG. 4 is an exploded perspective view of the retractable storage system of FIG. 3, a removable panel for storing earphone cables and a handheld device for assembling together in accordance with an exemplary embodiment of the claimed invention.

In accordance with an exemplary embodiment of the claimed invention, the top area 400 of case 100 covering the earphone jack 112 area is configured with a slightly burgeon compartment or bounded region 125 for mounting earphone/earbud station 115 (FIGS. 3 and 4). In accordance with an aspect of the claimed invention, earphone or earbud station 115 can comprise one aperture or two cylindrical apertures, sized to hold a pair of earphones 117, 119 (e.g., a wireless earphones or earbuds) with friction, but may be monolithically formed with case 100 (not separate) and may be also co-continuous (not separate openings). Alternatively, the earphone stations 107, 109 can comprise one opening to receive a pair of earbuds or earphones 117, 119. The material of earbud station 115 may be made of either plastic or an elastomeric or the combination of materials for elasticity. Adaptor rings may be provided (shown but not numbered) for adjusting a general opening to a reduced size for perfect fitting of a particular earbud to the station 115. Earbud connecting cables 121, 123 are contained inside the carrier case housing 111 through apertures of earphone station 115 and reel in and out during use.

In reference to FIGS. 3 and 4, carrier case 100 includes a middle cassette or plug-in panel 300 that is configured with one, two or more chambers 127, 129 for containing earphone/earbud cables 121,123. In accordance with an exemplary embodiment of the claimed invention, retractable mechanisms 127A, 129A, such as spring reels or spools 610 can be replaceably inserted into the chambers 127, 129 for automatic retraction of the earphone cables 121, 123 after use. The retraction mechanism is individually indexable (retraction, partial retraction, hold in position etc.) and each retraction mechanism is individually operable (one ear bud or both). An additional exterior antenna receiver/transmitter chip (not shown) may also be fixedly mounted inside the chambers, or proximate to the shell and body to enhance a cell phone signal receiving/sending capacity. Alternatively, the pair of earphones 117, 119 can be connected to a single earphone cable, thereby requiring only one chamber 127 for containing a single earphone/earbud cable 121 and only one retractable mechanism 127A for automatic retraction of the earphone cable 121 after use.

Earphone/earbud cables 121, 123 are guided with channels to the respective chambers 127, 129 where the rest of the cable length is coiled inside the chambers 127, 129. Earphone/earbud plug head 105 is guided by one of the channels to the top to be in the proximity of an earphone jack of handheld device 100. Earphone/earbud earplugs or earpieces 117, 119 are housed in or fit into earphone station 115, when in use, optionally one or both, can be pulled from the station 115, and retracted back to the station 115 after use using a continuous pull or a ratchet as is known in the electrical-power-cord-retraction-art.

Figure 23:
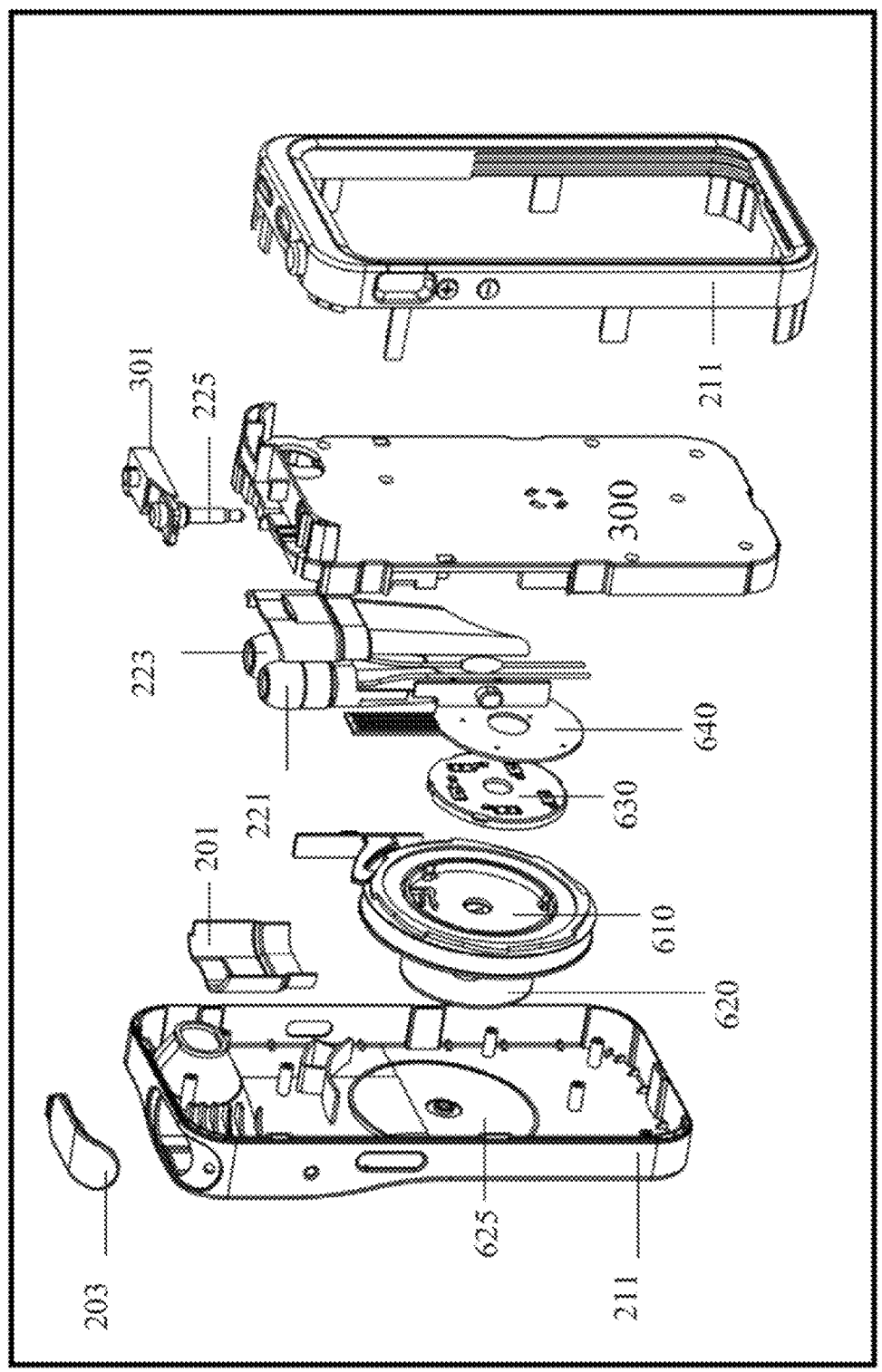
FIG. 23 is an exploded perspective view of a retractable storage system with a retractable mechanism for storing and retracting earphone cable in accordance with an exemplary embodiment of the claimed invention.

In accordance with an exemplary embodiment of the claimed invention, panel 300 is configured to be easily assembled with and into the exterior housing 111 and held by friction or a slight protrusion configured inside housing 111, and may be optionally sonically fixed (welded) or otherwise fixed in place. Similarly, the earbud station 201 can be assembled removably or in a fixed manner. As exemplary shown in FIG. 23, the carrier case 200 comprises a hinged cover 203 to open and close the aperture of the earbud station 201 or charging station 510.

Figure 18:
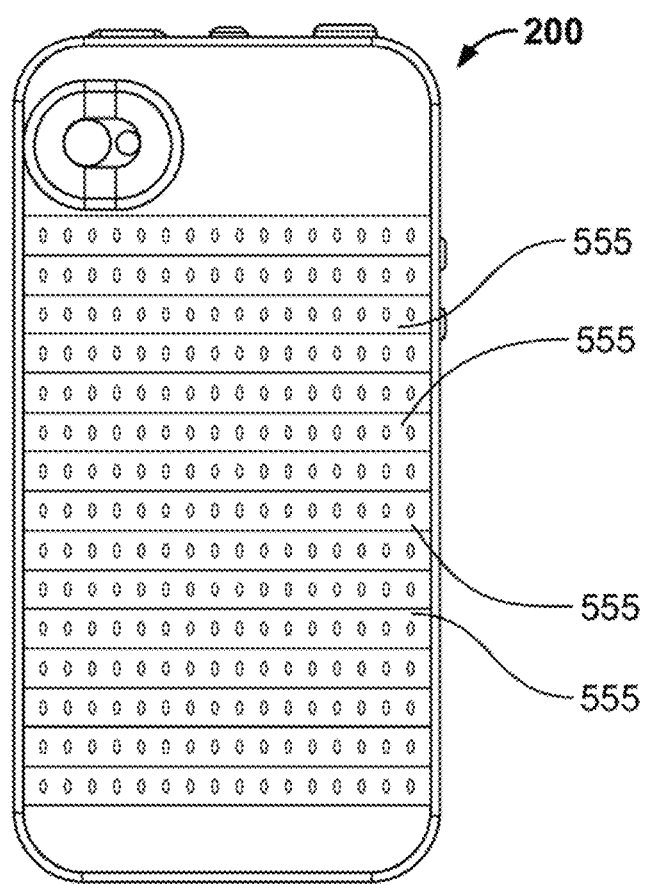
FIG. 18 is an exemplary back view of the retractable storage system with a plurality of colored LEDs in accordance with an exemplary embodiment of the claimed invention.

As will be understood by those of skill in the art, the outer housing thickness of 111 may also be formed with openings or transparent portions to show a brand region on the electronic device. Similarly, such openings or portions may be provided to receive retraction mechanisms 127A, 129A as a stylized configuration. In accordance with an exemplary embodiment of the claimed invention, as shown in FIG. 18, the carrier case 200 comprises multiple colored light emitting diodes (LEDs) 550 to display a logo, advertisement or aesthetically pleasing patterns on the back of the case. Preferably, the LED lights 550 are connected to electronic device via wire or wirelessly such that the electronic device can control and change the patterns, logo or advertisement displayed by the LEDs 550.

Figure 5:
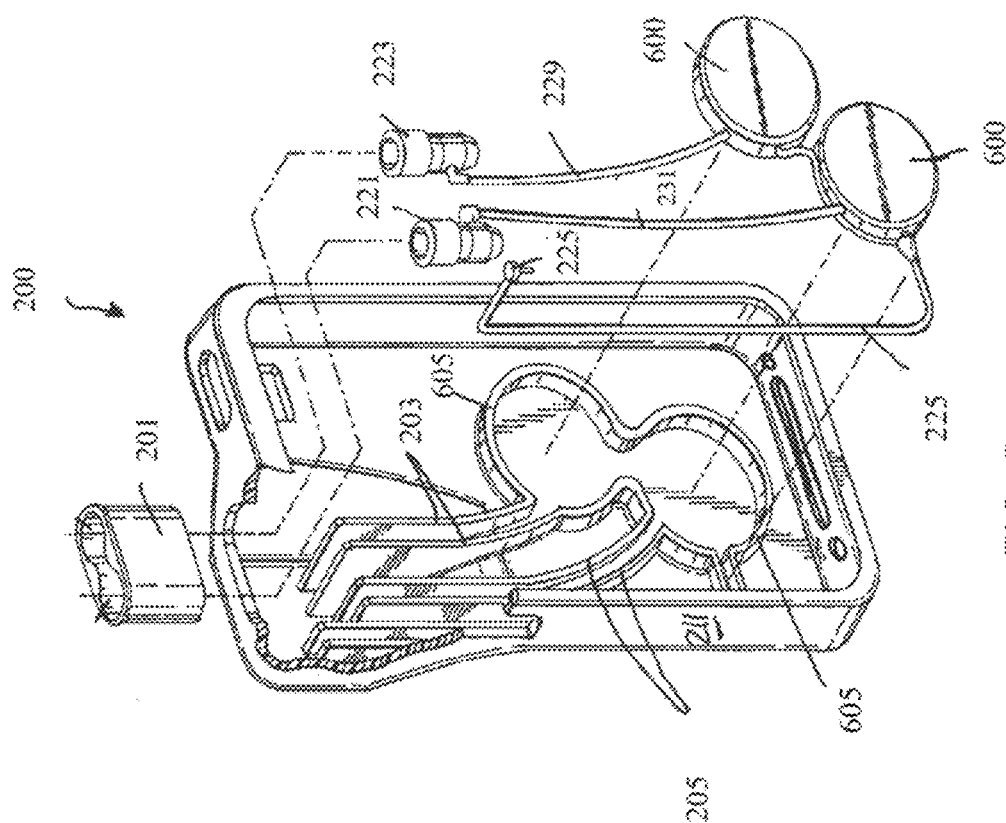
FIG. 5 is an exploded perspective view of a retractable storage system for storing earphone cables in accordance with an exemplary embodiment of the claimed invention.
Figure 8:
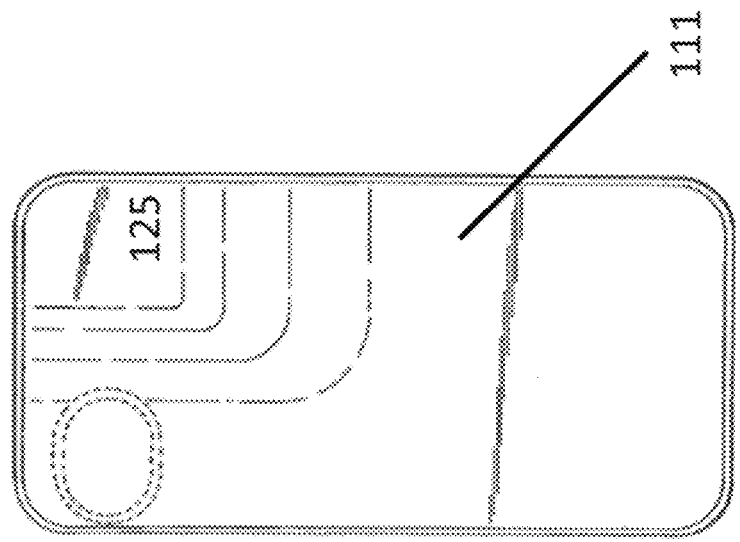
FIG. 8 is an exemplary back view of a retractable storage system in accordance with an exemplary embodiment of the claimed invention.
Figure 7:
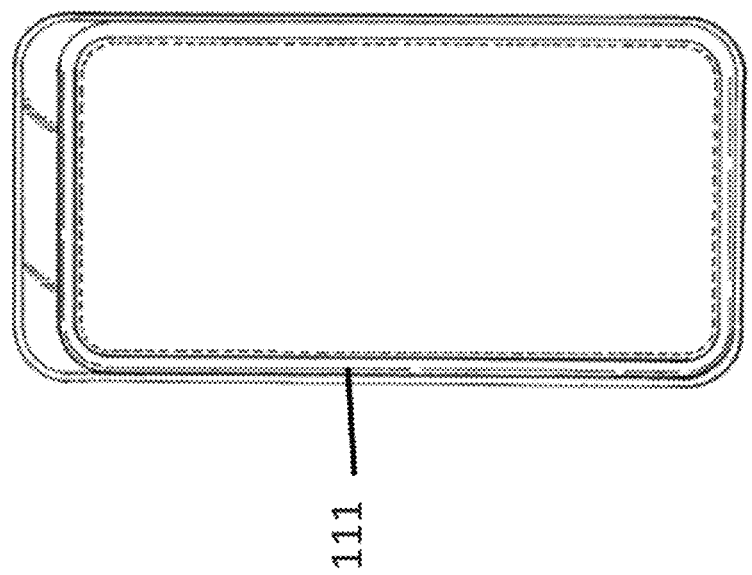
FIG. 7 is an exemplary front view of a retractable store system in accordance with an exemplary embodiment of the claimed invention.
Figure 11:
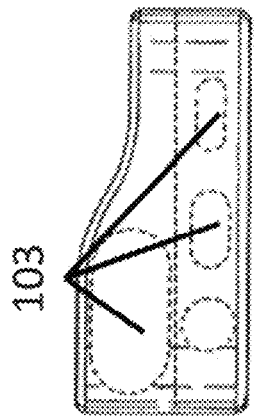
FIG. 11 is an exemplary top side view of a retractable storage system in accordance with an exemplary embodiment of the claimed invention.
Figure 12:
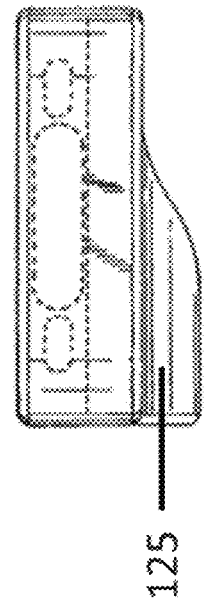
FIG. 12 is an exemplary bottom side view of a retractable storage system in accordance with an exemplary embodiment of the claimed invention.
Figure 10:
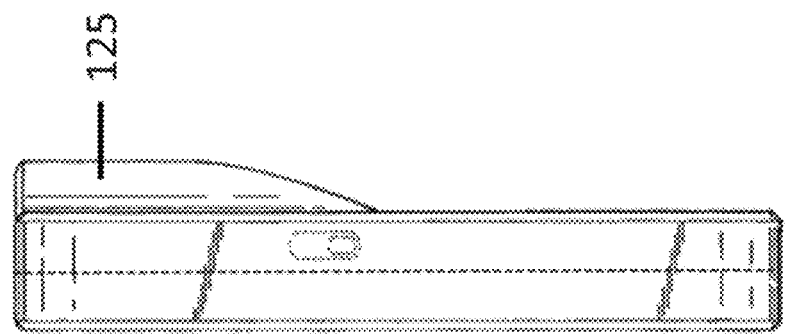
FIG. 10 is an exemplary left side view of a retractable storage system in accordance with an exemplary embodiment of the claimed invention.
Figure 9:
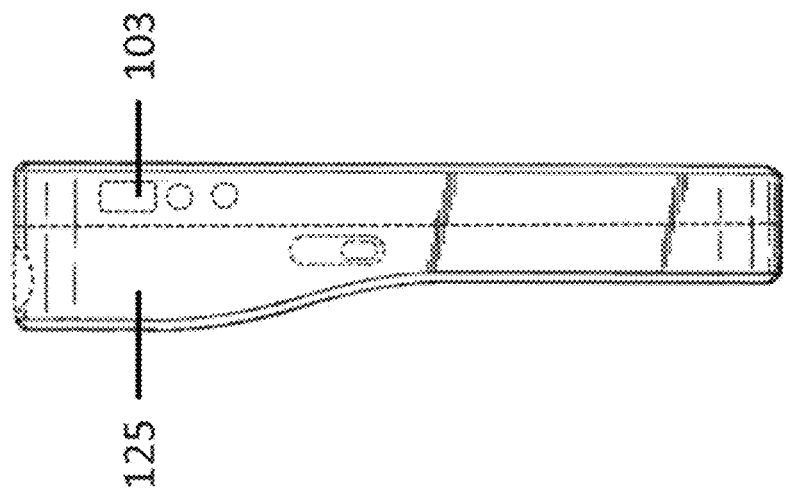
FIG. 9 is an exemplary right side view of a retractable storage system in accordance with an exemplary embodiment of the claimed invention.

The back panel of housing 111 is configured with a slightly enlarged bounding region or compartment 125 for mounting earphone/earbud station 115. In accordance with an exemplary embodiment of the claimed invention, as shown in FIG. 5, earbud/earphone station 201 is structured to be an elongated tubular structure with two or more apertures 203, 205 shaped to match an earplug head and can be removably positioned or can be fixed in place. In accordance with an exemplary embodiment of the claimed invention, the station holder 201 can be monolithically molded into the backing of the case 100, 200. The apertures of the earbud station 201 can be configured slightly bigger than most of the earplug heads but puffed with rubber like material, to able to fit an O-ring or other adaptive structures for elasticity and tight fitness. Panel 300 may be replaced with other types of configurations suitable for the particular electronic device. It is appreciated that the panel 300 can include openings or regions that allow use of any electronic-device camera/video, aperture, or brand indicia.

Figure 6:
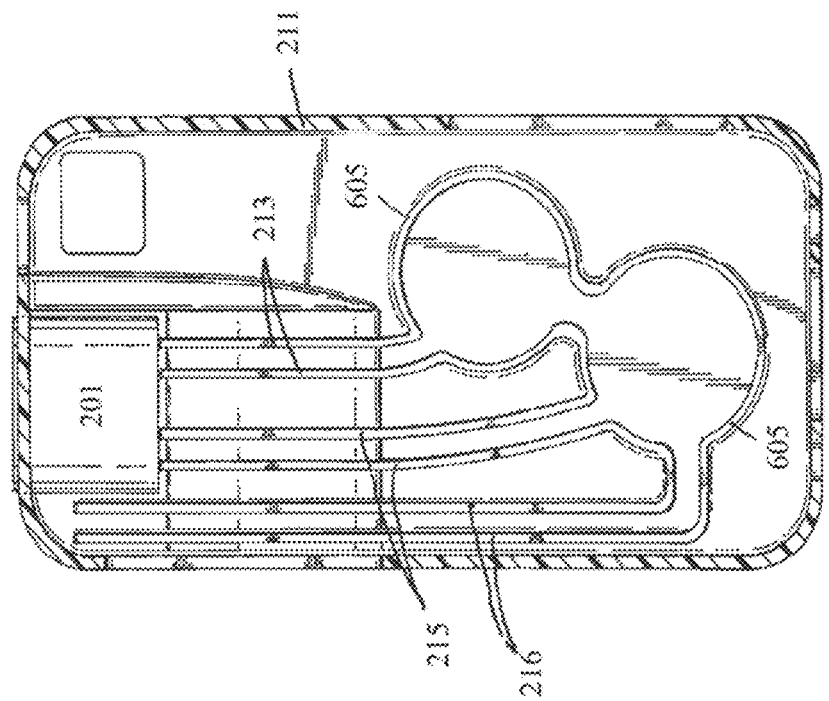
FIG. 6 is a partial sectional view of the retractable storage system of FIG. 5 in accordance with an exemplary embodiment of the claimed invention.

In accordance with an exemplary embodiment of the claimed invention, the chamber structure and channels can be monolithically, directly molded on the middle cassette or plug-in panel 300 or back panel of housing 211. In reference to FIGS. 5 and 6, the handheld device carrier case 200 comprises a housing 211 and one or more storage chambers 605 to removably house one or more accessories, such as earbud cables, wireless headbuds, headphone cables, e-cigarettes, cigars, cigarettes, lipsticks, lip balms, and like. In accordance with an exemplary embodiment of the claimed invention, the chambers 605 can house one or more retractable mechanism 600. Chamber structure 605 with one or more guiding channels 213, 215, 216 can be configured on the interior side of the back panel of housing 211 or on the plug-in panel 300. Earphone station 201 can be mounted at the top ends of the channels 213, 215. Channel 216 is configured for holding earphone plug head 225 to be plug into the earphone jack of a handheld device 110. Channels 213, 215 guide the earphone cables 229, 231 when they are pulled out for use and retracted into the respective retracting mechanism 600 for storage.

Figure 19:
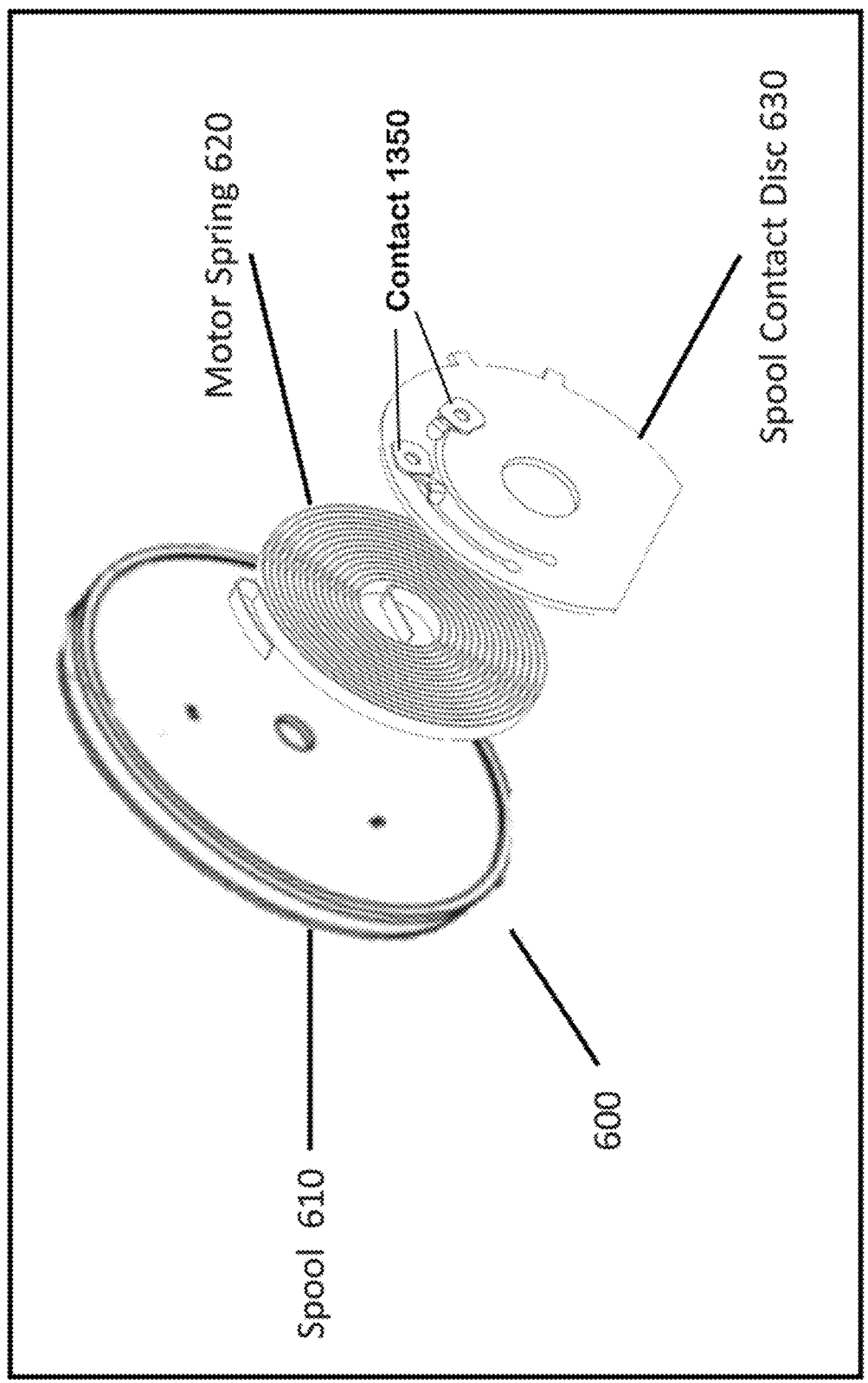
FIG. 19 is an exploded perspective view of a retractable mechanism for storing and retracting a cable in accordance with an exemplary embodiment of the claimed invention.
Figure 22:
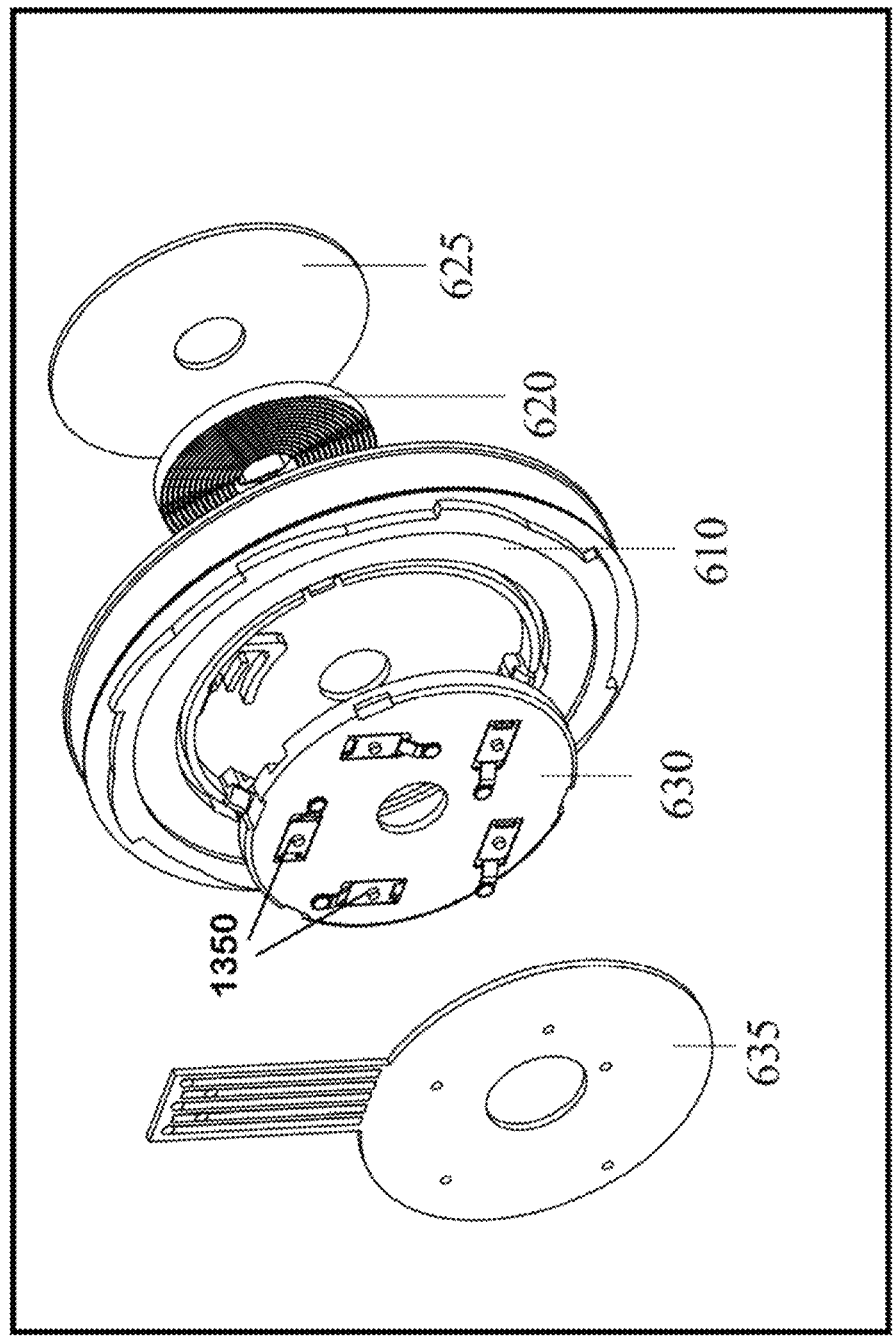
FIG. 22 is an exploded perspective view of a retractable mechanism for storing and retracting a cable in accordance with an exemplary embodiment of the claimed invention.

In accordance with an exemplary embodiment of the claimed invention, a spring box can be mounted inside each retractable mechanism 600 for automatic and independent retraction of the cables 229, 231 after use. As exemplary shown in FIG. 19, the retractable mechanism 600 comprises a spool 610 to store the cable, a motor spring 620 and a spool contact disc 630 to electrically connect the cables 231, 229 to an audio jack element or earphone plug 225 which connects to the handheld electronic device 110. To retract the cables 231, 229, the retractable mechanism 600 releases the motor spring 620 which rotates the spool 610 to roll or wrap the cables onto the spool. One or both cables 231, 229 are unwound from its respective spring-biased spool 610 by the user and the cables are wound on the spring biased spool 610 by the retractable mechanism 600 after use. Alternatively, as exemplary shown in FIGS. 22-23, the retractable mechanism 600 can comprise a washer 625 that abuts against the back panel of the housing 211, the motor spring 620, the spool 610, a spool contact disc 630 fasted or connected onto the spool 610 and a contact film 635, preferably a printed circuit board (PCB), which is fixed to the plug-in panel 300. The contacts on the spool contact disc 630 permits the cables 231, 229 on the rotating spool 610 to remain in electrical connection with the contact film 635. The contact film is electrically connected to the plug head 225.

In accordance with an exemplary embodiment of the claimed invention, the automatic retraction of the cables 229, 231 can be triggered by a gentle pull of the respective cable 229, 231 or by engaging a respective retraction or spool button 650, as exemplary shown in FIGS. 20 and 21. The retraction button 650 can be a push on/off button or a slidable retraction button moveable to the first and second positions. Each retracting mechanism 600 can be independently operated and controlled by the respective retraction button 650. As exemplary shown in FIG. 20A, the slidable retraction button 650 is moved to the second position (or moved towards the top end of the case) to engage the retractable mechanism 600 to retract the cables. As exemplary shown in FIG. 20B, the slidable retraction button 650 is moved to the first position (or moved towards the bottom end of the case) to prevent the retractable mechanism 600 from retracting the cables into the spool 610 but permitting the user to pull out more cable.

Figure 21B:
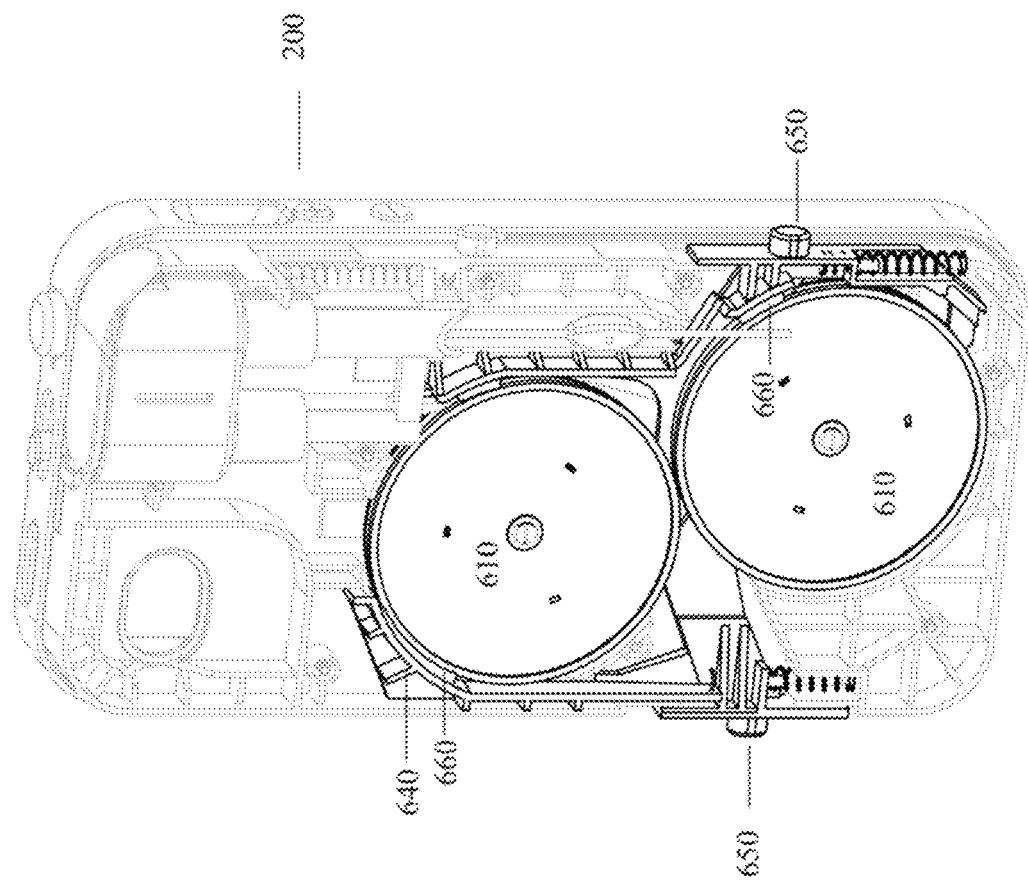
FIGS. 21A-B are perspective views of a retractable storage system with a retractable mechanism and a friction based braking system disengaged and engaged, respectively, for controlling the speed of the spring loaded spool in accordance with an exemplary embodiment of the claimed invention.
Figure 21A:
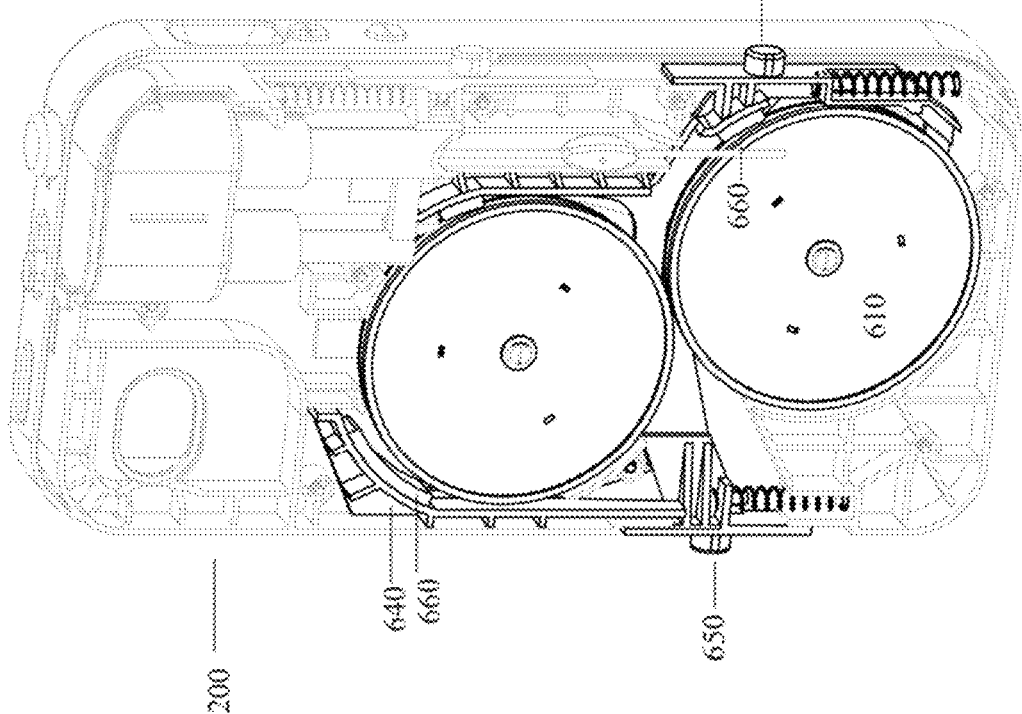

In accordance with an exemplary embodiment of the claimed invention, as exemplary shown in FIGS. 21A-B, the slidable retraction button 650 is spring loaded such that it remains in the first position until the retraction button 650 is moved to second position to retract the cables 229, 231 and returns automatically to the first position when the retraction button 650 is released. That is, the retraction button 650 must be held in the second position to retract the cables 229, 231, otherwise the retraction button 650 returns to the first position. The user moves the retraction button 600 to the second or "retract" position by sliding the button towards the bottom end of the case and holds the retraction button 650 to retract the respective cables 229, 231 onto their respective spool or reel 610, and the release of the retraction button 650 stops or disengages the retractable mechanism 600. That is, two cables 229, 231 can be pulled independently from its respective spool 610 to pull out a different cable length, e.g., 1 foot of cable 231 is pulled out and 2 foot of cable 229 is pulled out. Additionally, for example, cable 231 can be retracted independent of cable 229, such that the earbud 221 connected to cable 231 is completely retracted into the earphone/earbud station 201 while the earbud 223 connected to cable 229 remains outside of the earphone/earbud station 201.

In accordance with an exemplary embodiment of the claimed invention, the earbuds 221 and 223 can be attached to the same cable, thereby requiring only one retracting mechanism 600, as exemplary shown in FIGS. 20A-B and 24A-B. The earbuds 221, 223 docketed or stored in the earbud station 201 when not in use can be retrieved or ejected from the earbud station 201. In accordance with an exemplary embodiment of the claimed invention, the carrier case 200 comprises an accessory button 655 to slide out the earbuds 221, 223 from the earbud station 201, as exemplary shown in FIGS. 24A-B. The accessory button 655 is moved towards the earbud station 201 to slide out the earbuds 221, 223 and is moved away from the earbud station 201 to slide the earbuds 221, 223 into the earbud station 201. Alternatively, the accessory button 655 can be spring loaded, similar to the retraction button 650, so that the accessory button 655 remains in or returns to the first position (as exemplary shown in FIG. 24A) unless the accessory button 655 is moved to and held at the second position to eject or slide out the earbuds 221, 223 from the earbud station 201 (as exemplary shown in FIG. 24B).

In accordance with an exemplary embodiment of the claimed invention, as exemplary shown in FIGS. 21A-21B, each retractable mechanism 600 comprises a friction based braking system 640 to control and reduce the speed of the spring reel or spool 610 when the cables 229, 231 are being retracted into the retractable mechanism 600. The motor spring 620 of the spring loaded retractable mechanism 600 can rotate the spring reel or spool 610 at drastic, uncontrollable speed upon release of the spring loaded mechanism 600 to retract the cable, thereby potentially stretching or even damaging the cables 229, 231. In accordance with an aspect of the claimed invention, the friction based braking system 640 comprises one or more damping pads 660 to slow down the spring reel or spool 610. For example, when the spring loaded retractable mechanism 600 is in retraction mode (the retraction button 650 is in the second or retract position, as exemplary shown in FIG. 21B), the damping pads 660 are engaged to apply pressure to the spool 610 to slow its rotational speed.

Figure 26B:
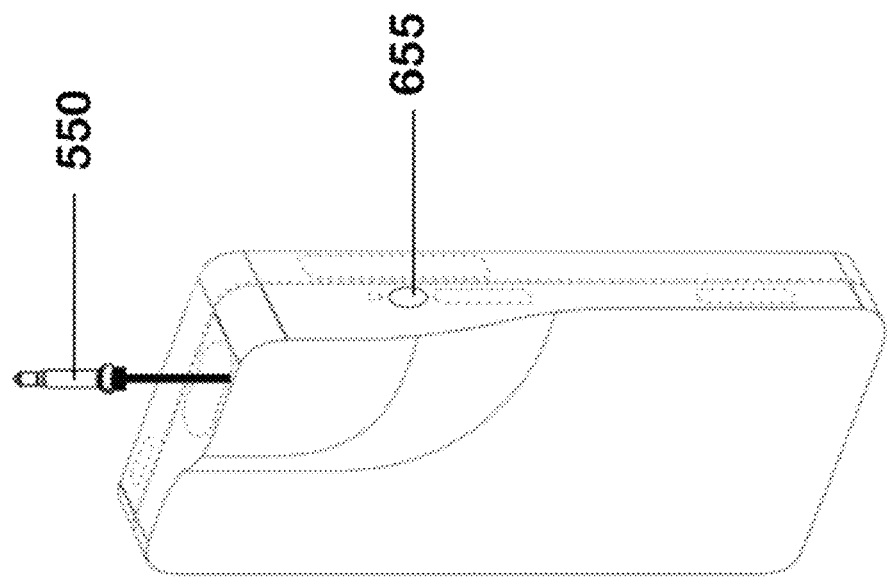
FIGS. 26A-B are back view and perspective view of a retractable storage system for storing and dispensing a headphone plug/cable for use with a standard headphone in accordance with an exemplary embodiment of the claimed invention.
Figure 26A:
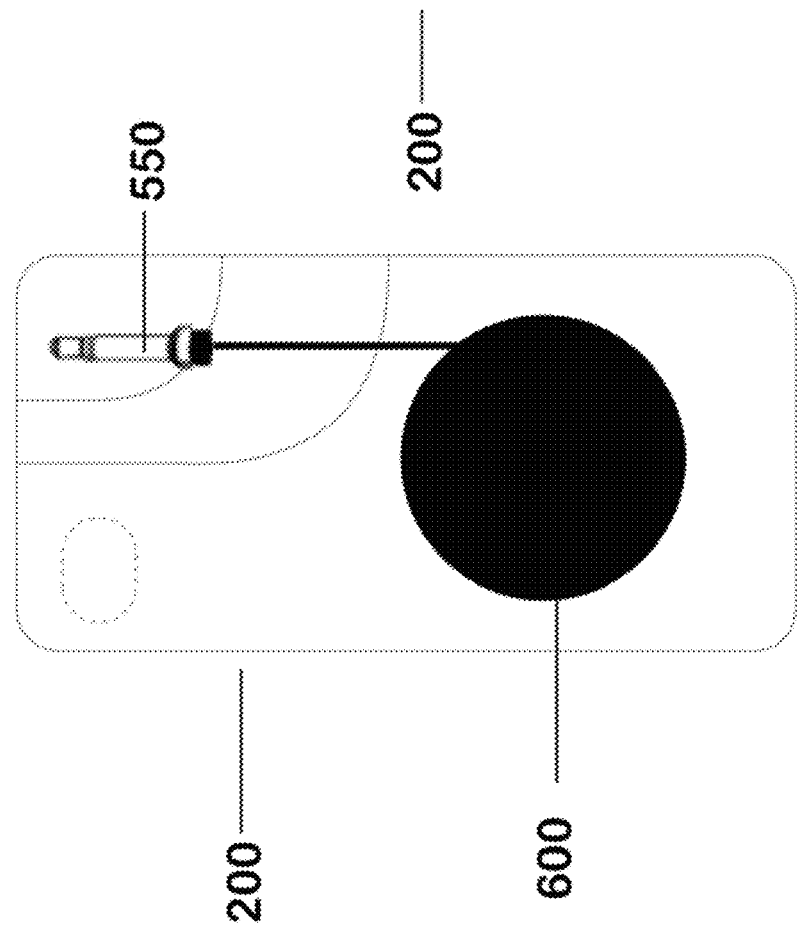

In accordance with an exemplary embodiment of the claimed invention, as exemplary shown in FIGS. 26A-B, the storage chamber 501, 605 and retraction mechanism 600 retracts and stores the headphone plug/cable 550 for use with a standard headphone (not shown). The retractable mechanism 600, preferably comprising the friction based braking system 640, automatically retracts the headphone plug/cable 550 after use. Similar to the earbud cables 229, 231, the automatic retraction of the headphone plug/cable 550 can be triggered by a gentle pull on the cable 550 or by engaging the retraction button 650. The headphone plug 550 docketed or stored in the earbud station 201 when not in use can be retrieved or ejected from the earbud station 201. Similar to the earbuds 221, 223, the station 201 is configured to accommodate the headphone plug 550 and the accessory button 655 slides the headphone plug 550 in and out of the station 201, as exemplary shown in FIGS. 26A-B. The accessory button 655 is moved towards the station 201 to slide out the headphone plug 550 and is moved away from the station 201 to slide the headphone plug 550 into the station 201. Alternatively, the accessory button 655 can be spring loaded such that the accessory button 655 remains in or returns to the first or "rest" position until the accessory button 655 is moved to second position to eject or slide out the headphone plug 550 from the station 201. The headphone plug 500 can be used with the headphone by inserting the pulled out headphone plug 550 into an audio port on the headphone or headset (not shown).

In accordance with an exemplary embodiment of the claimed invention, the cables 231, 229 can be magnetized such that two cables 231, 229 act as a single cable. A magnetic compound powder can be added to the molten rubber/plastic coating to the first cable 231 and a ferrous metal powder can be added to the molten rubber/plastic coating the second cable 229. Once cured and molded, these two separable cables 231, 229 are magnetically attracted to each other to form a single cable but allowing the user to peal apart into two cables. Depending on the application of the claimed invention, the magnetized cables 231, 229 can operate with a dual retractable mechanism 600 or a single retractable mechanism 600. In accordance with an exemplary embodiment of the claimed invention, the two magnetized cables 231, 229 are independently retracted by the respective dual retractable mechanism 600. Channels 213, 215 separates the two magnetized cables 231, 229 and guide the two magnetized cables 231, 229 when they are pulled out and retracted into the respective dual retractable mechanism 600. When two earbuds 221, 223 attached to the two magnetized cables 231, 229 are pulled out from the earphone station 201, the two magnetized cables 231, 229 are magnetically attracted to each other to form a single cable and the user can peel apart a section of the two magnetized cables 231, 229 to separate the earbuds 221, 223.

In accordance with an exemplary embodiment of the claimed invention, the two magnetized cables 231, 229 are magnetically attached to form a single cable and retracted into the same retractable mechanism. That is, one of the channel 213, 215 guides both magnetized cables 231, 229 when they are pulled out and retracted into the same retractable mechanism 600. When two earbuds 221, 223 attached to the two magnetized cables 231, 229 are pulled out, the user can separate the two magnetically attached cables 231, 229 into two separate cables 231, 229 of desired length.

Figure 17:
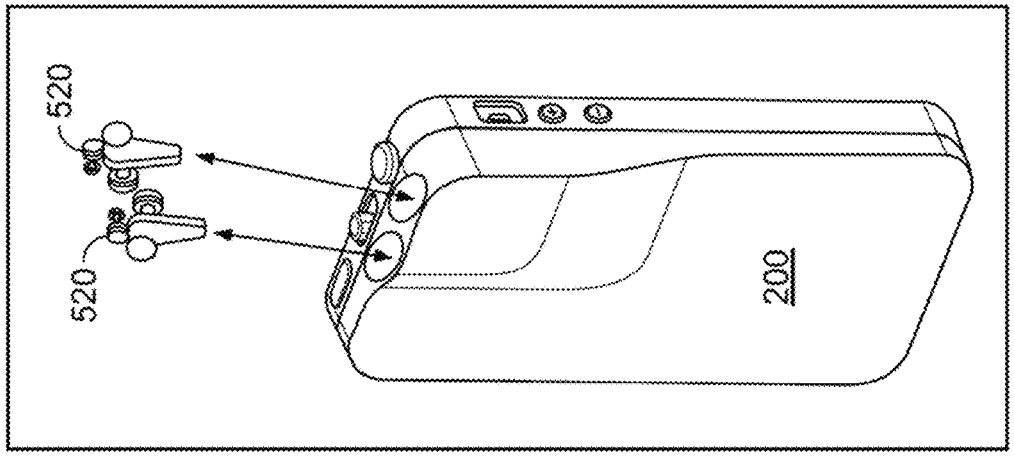
FIG. 17 is an exemplary perspective view of the retractable storage system for storing, charging and dispensing wireless earbuds in accordance with an exemplary embodiment of the claimed invention.
Figure 16:
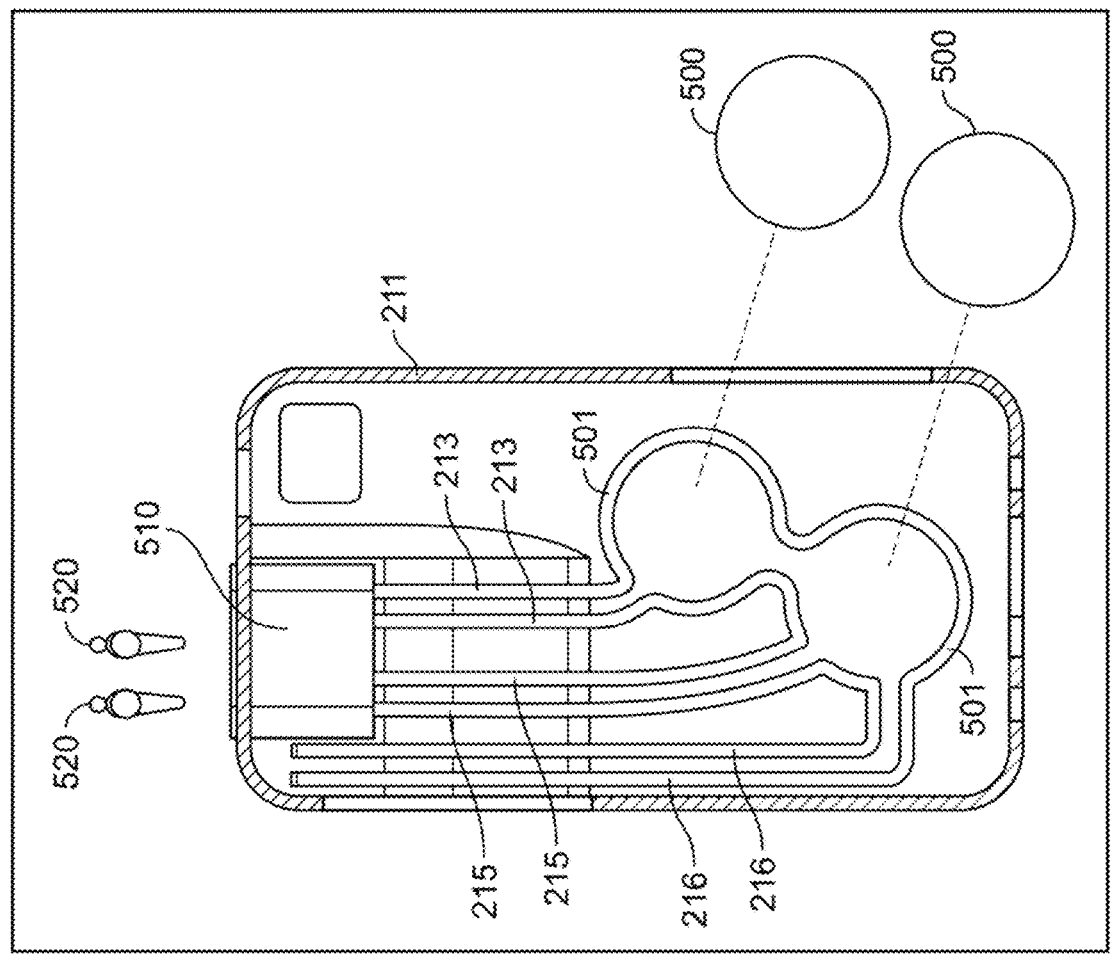
FIG. 16 is a partial section view of the retractable storage system with battery chambers in accordance with an exemplary embodiment of the claimed invention.

In accordance with an exemplary embodiment of the claimed invention, as shown in FIGS. 16-17, the back panel of carrier case 200 or one side of the plug-in panel 300 can comprise one or more storage chambers 501 to house one or more batteries 500 instead of the retractable mechanisms 600. Although, the storage chambers 501 are shown as circular in FIG. 16, it is appreciated that the storage chamber 501 can be shaped to house a different shaped battery 500, such as a square or rectangular shaped battery 500. The battery 500 is operable to extend the battery life of the electronic device and/or charge the wireless earbuds 520, preferably Bluetooth™ earbuds 520, when it is placed in the charging station 510. The wireless earbuds 520 click in and out of the charging station 510. The wireless earbuds 520 communicates wirelessly, such as via Bluetooth, with the electronic device 110. Preferably, the accessory button 655 can be used to dispense or pushed out the wireless earbuds 520 from the charging station 510, as exemplary shown in FIGS. 24A-B with wired earbuds 221, 223. The battery chambers 501 are in electrical connection with the electronic device and the charging station 510. In accordance with an aspect of the claimed invention, the guides 213, 215 houses wires connecting the earbud station 510 and guide 216 can be used to house wires connecting the battery 500 to the electronic device. Accordingly, the claimed system provides protection, storage and battery management to wireless Bluetooth earphones and smartphones. Although two storage chambers 501 and two batteries 500 are shown in FIG. 16, it is appreciated that the carrier case 200 can comprise one storage chamber 501 to house one battery 500.

In accordance with an exemplary embodiment of the claimed invention, as exemplary shown in FIG. 25A-B, the back panel of carrier case 200 or one side of the plug-in panel 300 can be monolithically, directly molded with chambers and/or channels to house one or more accessories 530, such as lipsticks, lip protection balm, cigarettes, cigars or electronic cigarettes (or e-cigarettes). The ejection button 655 can be used to retrieve, push out or eject an accessory from the storage chambers 501. It is appreciated that although the storage chamber 501 is illustrated as being circular in FIG. 16, it can be molded into any shape to accommodate different shaped accessories, such as a tubular shaped storage chamber to store e-cigarette, cigar, cigarette, lip balm or lipstick, as exemplary shown in FIGS. 25A-B. As with the wireless earbuds 520, the charging station 510 charges the e-cigarette 530 using the internal battery 500 when it is stored in the storage chamber 501 and can be ejected from the storage chamber 501 by the retraction button 650, as exemplary shown in FIG. 25B.

In accordance with an exemplary embodiment of the claimed invention, an exterior antenna transmitter/receiver maybe fixedly mounted into the chamber structures 605 to enhance the signal reception of the handheld electronic device, such as a cellular or WI-FI reception for a cell phone.

In accordance with an exemplary embodiment of the claimed invention, as shown in FIG. 18, the carrier case 200 comprises multiple colored LED lights 550 to display a logo, advertisement or aesthetically pleasing patterns on the back of the case. Preferably, the LED lights 550 are connected to electronic device via wire or wirelessly such that the electronic device can control and change the patterns, logo or advertisement displayed by the LED lights 550.

Other features exterior look may be configured as described in FIGS. 7-12 for matching a handheld device, with sufficient apertures configured on the sides for accessing the buttons of the device. These views are provided for non-limiting illustrative purposes. As will be noted in FIG. 13, the upper lip region is slightly larger to encompass the particular audio jack (3.5 mm type) in these versions, but should jack-access be on the bottom region, the larger region in the case would be optionally positioned to allow insertion and removal appropriate to the electronic device. Although, FIGS. 7-12 show the carrier case for use with a cell phone or smart phone, it is appreciated that the inventive carrier case can be applied to any hand held electronic device, such as a tablet, e-reader, MP3 device and a remote control device for controlling operating an electronic device, such as TVs, blu-ray players, video-streaming players, etc.

Figure 13B:
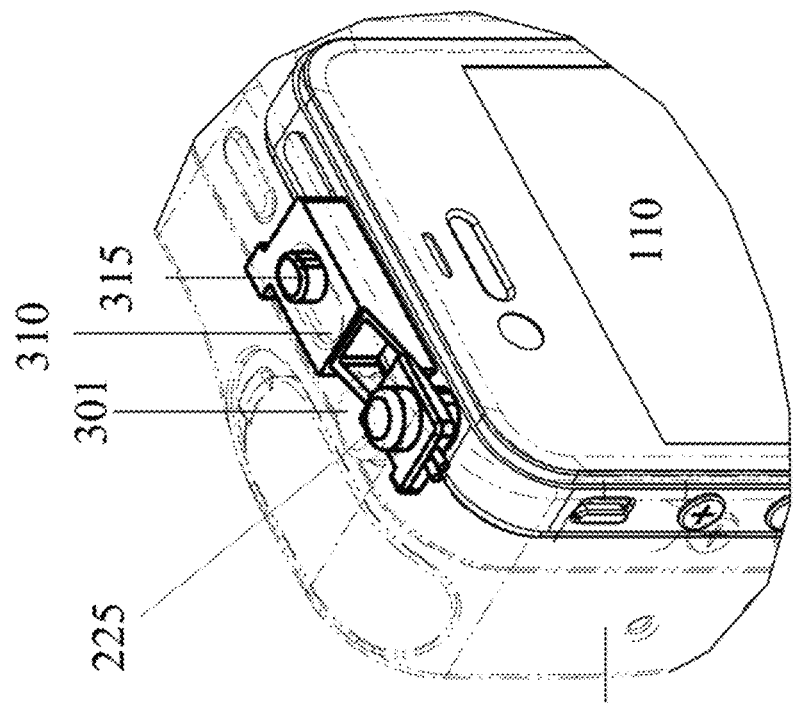
FIGS. 13A-B are exemplary illustrative views of an operative wedge-actuation system for removing and re-installing an audio jack element (3.5 mm type or other) from the electronic device in accordance with an exemplary embodiment of the claimed invention.
Figure 13A:
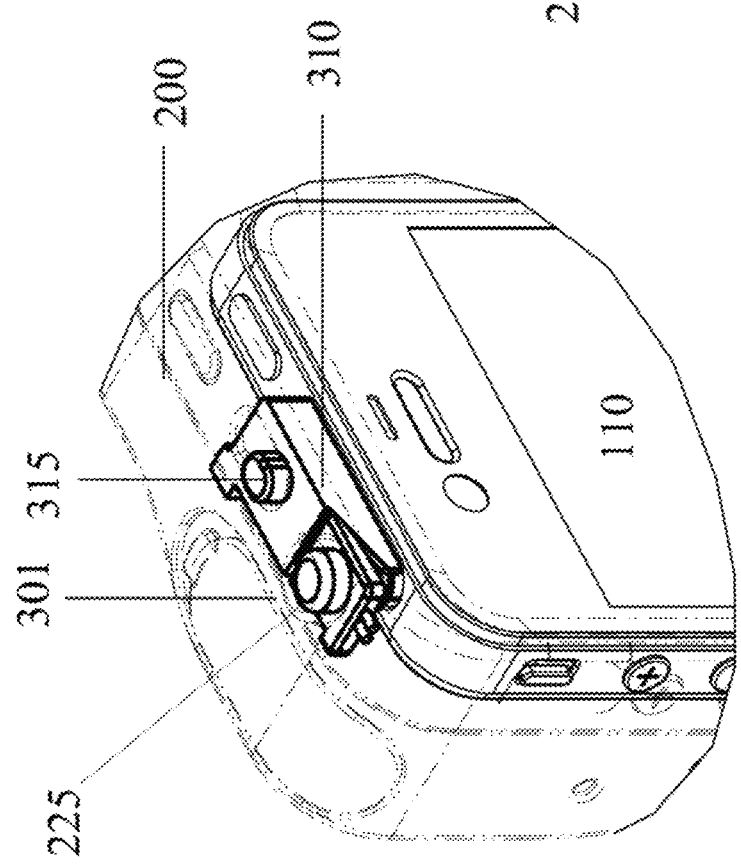
Figure 15:
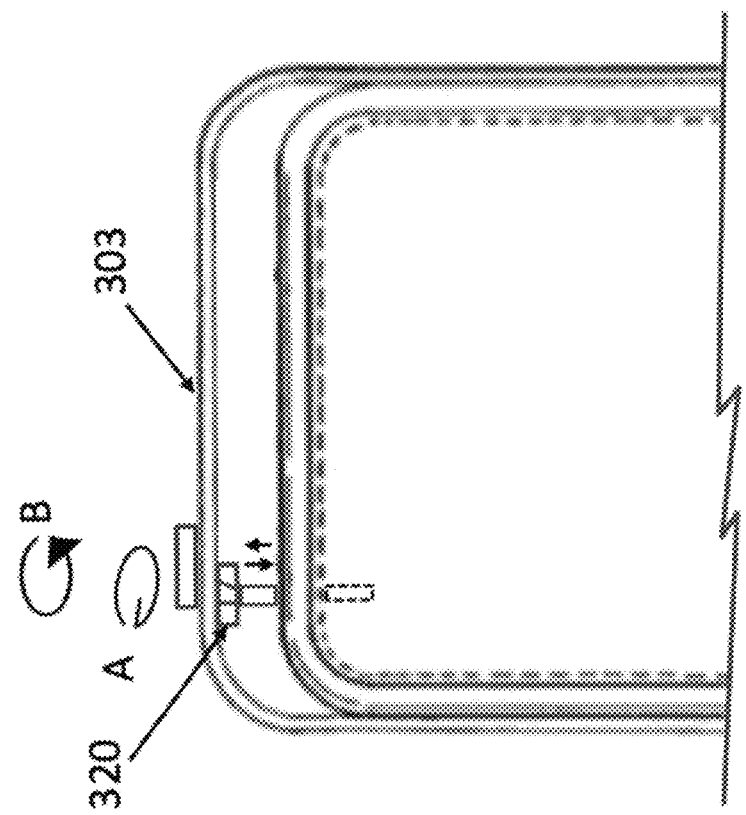
FIG. 15 is an exemplary illustrative exemplary view of an operative twist-actuation system for removing and re-installing an audio jack element from the electronic device in accordance with an exemplary embodiment of the claimed invention.
Figure 14:
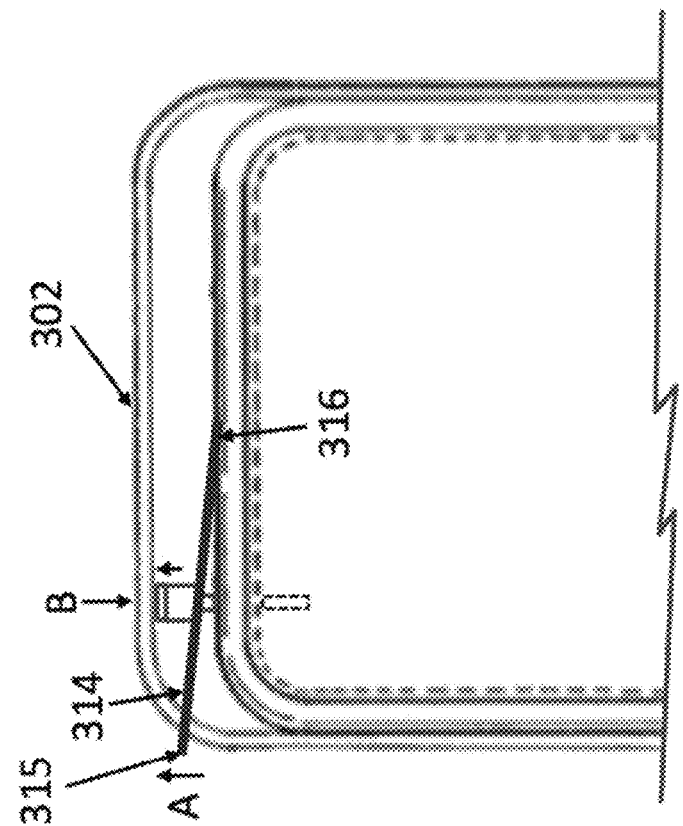
FIG. 14 is an exemplary illustrative view of an operative lever-actuation system for removing and re-installing an audio jack element from the electronic device in accordance with an exemplary embodiment of the claimed invention.

Regarding FIGS. 13-15, illustrative exemplary actuation systems 301, 302, 303 in accordance with embodiments of the claimed invention are provided. In actuation system 301 as exemplary shown in FIGS. 13A-B, an audio jack element or earphone plug (e.g., 105, or 225) can be removed and inserted using a wedge member 310 by the moving or sliding the plug button 315 towards the jack element 225 (as exemplary shown in FIG. 13A) to drive wedge 310 under and thus lift the jack element 225 out of the receiving hole 112 (e.g., an audio port) in the handheld electronic device 110. Thereafter, the plug button 315 is moved away from the jack element 225 (as exemplary shown in FIG. 13B) and the jack element 225 is pushed downwardly into the receiving hold 112 to reinstall the jack for desired use. In this way, a user can easily (and one-handedly) remove and reinsert the jack element 225 and thus activate and deactivate the earbud system.

As exemplary shown in FIG. 14, a lever member 314 has a projecting portion 315 through a case opening and a fixed position 316 allowing member 314 to operate as a pivot lever. Lever member 314 is configured to capture the jack element or earphone plug 105, 225 and control its movement relative to the insertion axis, and thus similarly lifting or removing the earphone plug 105, 225 in direction A from the receiving hole 112 of the electronic device and inserting the earphone plug 105, 225 in direction B into the receiving hole 112 of the electronic device.

As exemplary shown in FIG. 15, a pivot member 320 is captively pivotable within case 100, 200 to operably secure the jack member or earphone plug 105, 225 to the electronic device. The pivot member 320 is operable in pivot motion A to remove earphone plug 105, 225 from the receiving hole 112 of the electronic device and operable in pivot motion B to insert the earphone plug 105, 225 into the receiving hole 112 of the electronic device. Such pivoting may be threaded (both pivot and rising/lowering), or may be a pivot-wedge system (pivot-driving-a-wedge for lifting with press-return) without departing from the scope and spirit of the present invention. As will be understood by those of skill in the art, each of these alternative and operative mechanisms, or means, are insertion-removal means and are not limited to the present alternative illustrations, but instead include all related variations that accomplish a similar function.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the embodiments of the claimed invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A storage system comprising:
   a protective housing member configured to mate with a handheld electronic device;
   at least one integrated circuit, said at least one integrated circuit being either a component of the handheld electronic device or a component of the protective housing member;
   wherein the protective housing member comprises a charging area;
   wherein the charging area is formed between a surface of the protective housing member and a surface of at least one accessory item of the handheld electronic device;
   a plug head mounted on the protective housing member, the plug head being configured to electronically connect to a port of the handheld electronic device and configured to transmit at least one of data and power between at least two of the following: the protective housing member, said at least one accessory item and the handheld electronic device;
   wherein the charging area configured to charge said at least one accessory item; and
   wherein the charging area is powered by at least one power component of the protective housing member or at least one power component of the handheld electronic device.

2. The storage system of claim 1, wherein said at least one power component comprises a battery.

3. The storage system of claim 2, wherein the battery is housed within the protective housing member.

4. The storage system of claim 3, wherein said at least one integrated circuit is configured to operate as a charge controller to the battery.

5. The storage system of claim 2, wherein the battery is a battery of the handheld electronic device.

6. The storage system of claim 5, wherein said at least one integrated circuit is configured to operate as a charge controller to the battery.

7. The storage system of claim 1, wherein said at least one integrated circuit comprises a wireless transmitter configured to transmit a wireless signal between at least two of the following: the protective housing member, the handheld electronic device and said at least one accessory item.

8. The storage system of claim 7, wherein said at least one integrated circuit is configured to control transmission of at least one of electrical power and data signals between at least two of the following: the protective housing member, the handheld electronic device and said at least one accessory item.

9. The storage system of claim 8, wherein said at least one integrated circuit comprises at least one electrical wire, said at least one electrical wire being configured in a continuous loop formation.

10. The storage system of claim 9, wherein said at least one electrical wire is configured to transmit an electrical current between at least two of the following: the protective housing member, said at least one accessory item and the handheld electronic device.

* * * * *